(12) United States Patent
Goto et al.

(10) Patent No.: US 9,640,556 B2
(45) Date of Patent: May 2, 2017

(54) THIN FILM TRANSISTOR

(71) Applicant: KOBE STEEL, LTD., Kobe-shi (JP)

(72) Inventors: Hiroshi Goto, Kobe (JP); Aya Miki, Kobe (JP); Mototaka Ochi, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 15/109,553

(22) PCT Filed: Jan. 15, 2015

(86) PCT No.: PCT/JP2015/050948
§ 371 (c)(1),
(2) Date: Jul. 1, 2016

(87) PCT Pub. No.: WO2015/108110
PCT Pub. Date: Jul. 23, 2015

(65) Prior Publication Data
US 2016/0329353 A1    Nov. 10, 2016

(30) Foreign Application Priority Data
Jan. 15, 2014    (JP) .................................. 2014-005363

(51) Int. Cl.
*H01L 29/10*    (2006.01)
*H01L 27/12*    (2006.01)
(Continued)

(52) U.S. Cl.
CPC ........ *H01L 27/1225* (2013.01); *G02F 1/1368* (2013.01); *H01L 29/41733* (2013.01);
(Continued)

(58) Field of Classification Search
CPC ........... H01L 27/1225; H01L 29/41733; H01L 29/786; H01L 29/78618; H01L 29/7869; H01L 29/78696; G02F 1/1368
(Continued)

(56) References Cited

U.S. PATENT DOCUMENTS 8,566,502 B2    10/2013 Vaghani
9,299,474 B2 *    3/2016 Morita ............. H01L 21/02554
(Continued)

FOREIGN PATENT DOCUMENTS

JP    2009-4787 A    1/2009
JP    4568828 B2    10/2010
(Continued)

OTHER PUBLICATIONS

International Search Report and Written Opinion issued Apr. 14, 2015 in PCT/JP2015/050948 filed Jan. 15, 2015.

*Primary Examiner* — Tu-Tu Ho
(74) *Attorney, Agent, or Firm* — Oblon, McClelland, Maier & Neustadt, L.L.P.

(57) ABSTRACT

Provided is a thin film transistor that has high mobility and excellent stress resistance and is good typically in adaptability to wet etching process. The thin film transistor includes a substrate, and, disposed on the substrate in the following sequence, a gate electrode, a gate insulator film, oxide semiconductor layers, source-drain electrodes, and a passivation film that protects the source-drain electrodes. The oxide semiconductor layers have a first oxide semiconductor layer including In, Ga, Zn, Sn, and O, and a second oxide semiconductor layer including In, Ga, Sn, and O. The second oxide semiconductor layer is disposed on the gate insulator film. The first oxide semiconductor layer is disposed between the second oxide semiconductor layer and the passivation film. The atomic ratios in contents of the individual metal elements to all the metal elements constituting the first and the second oxide semiconductor layers are controlled to predetermined ratios.

11 Claims, 2 Drawing Sheets

(51) Int. Cl.
*G02F 1/1368* (2006.01)
*H01L 29/786* (2006.01)
*H01L 29/417* (2006.01)

(52) U.S. Cl.
CPC ........ *H01L 29/786* (2013.01); *H01L 29/7869* (2013.01); *H01L 29/78618* (2013.01); *H01L 29/78696* (2013.01)

(58) Field of Classification Search
USPC .......................................................... 257/43
See application file for complete search history.

(56) References Cited

U.S. PATENT DOCUMENTS

| | | |
|---|---|---|
| 2007/0194379 A1 | 8/2007 | Hosono et al. |
| 2008/0315193 A1 | 12/2008 | Kim et al. |
| 2009/0278122 A1 | 11/2009 | Hosono et al. |
| 2009/0280600 A1 | 11/2009 | Hosono et al. |
| 2011/0049508 A1 | 3/2011 | Kawamura et al. |
| 2011/0101352 A1 | 5/2011 | Hosono et al. |
| 2011/0201162 A1 | 8/2011 | Hosono et al. |
| 2012/0012838 A1 | 1/2012 | Hosono et al. |
| 2012/0119207 A1 | 5/2012 | Goto et al. |
| 2012/0126227 A1 | 5/2012 | Maeda et al. |
| 2012/0153277 A1 | 6/2012 | Yaginuma et al. |
| 2012/0295399 A1 | 11/2012 | Kim et al. |
| 2013/0009111 A1 | 1/2013 | Morita et al. |
| 2015/0076488 A1 | 3/2015 | Kishi et al. |
| 2015/0123116 A1 | 5/2015 | Goto et al. |
| 2015/0171221 A1 | 6/2015 | Miki et al. |
| 2015/0206978 A1 | 7/2015 | Miki et al. |

FOREIGN PATENT DOCUMENTS

| | | |
|---|---|---|
| JP | 2011-54812 A | 3/2011 |
| JP | 2012-146956 A | 8/2012 |

* cited by examiner

THIN FILM TRANSISTOR

TECHNICAL FIELD

The present invention relates to thin film transistors (TFTs), which are used for display devices such as liquid crystal displays (LCDs) and organic electroluminescent displays.

BACKGROUND ART

Oxide semiconductors have higher mobility and larger optical band gaps, and can be deposited at lower temperatures, as compared with general amorphous silicon (a-Si). The oxide semiconductors are therefore expected to be applied typically to next-generation displays and to resin substrates, where the next-generation displays require large sizes, high resolutions, and high-speed drive, and the resin substrates have poor heat resistance. For example, an IGZO semiconductor is generally used as the oxide semiconductor. The IGZO semiconductor refers to an amorphous oxide semiconductor including indium, gallium, zinc, and oxygen (In—Ga—Zn—O) (Patent Literature 1).

Demands for still higher mobility have been made more and more on such oxide semiconductors. For example, assume that an oxide semiconductor is allowed to have higher mobility at a level equal to the mobility level (about 40 to about 100 $cm^2/Vs$) of low-temperature poly-silicon (LTPS). In this case, the oxide semiconductor can be used in production of positive channel metal oxide semiconductor (PMOS) transistors and complementary metal oxide semiconductor (CMOS) transistors. Extremely advantageously, this enables, for example, narrower bezel, in which the bezel surrounding a liquid crystal panel is allowed to be narrower, and enables lower cost of the panel.

In addition, TFTs using oxide semiconductors are required to have excellent stress resistance, namely, the TFTs are required to offer a smaller change in threshold voltage between before and after the application of stress, such as the application of a voltage and/or light. For example, it has been pointed out as follows. When a voltage is continuously applied to the gate electrode or when light in the blue band, at which light absorption starts, is continuously applied, charges are trapped at the interface between the gate insulator film and the oxide semiconductor layer in a TFT. This changes the electric charge in the oxide semiconductor layer and thereby significantly shifts the threshold voltage toward a negative side, and this causes the TFT to change in switching behavior. Independently, light leaked out from liquid crystal cells is applied to the TFT upon liquid crystal panel drive or upon lightening of a picture element (pixel) via the application of a negative bias to the gate electrode. This light applies stress to the TFT and causes image irregularities and/or deterioration in TFT characteristics. Upon actual use of the TFT, the change in switching behavior caused by stress due to the application of light or voltage causes deterioration in reliability of the display device itself.

Likewise, organic electroluminescent displays disadvantageously suffer from variations in values typically of threshold voltage, because light leaked out from the light-emitting layer is applied to the semiconductor layer.

As is described above, strong demands are made to improve stress resistance, because the threshold voltage shift, in particular, causes deterioration in reliability of display devices including TFTs. The display devices are exemplified by liquid crystal displays (LCD) and organic electroluminescent displays.

In addition, a thin oxide semiconductor film is exposed to various chemicals (chemical solutions) during preparation of a TFT substrate bearing the thin oxide semiconductor film and source-drain electrodes disposed on or over the thin oxide semiconductor film. Thus, the thin oxide semiconductor film is also required to have resistance to the chemicals. For example, etching via dry etching or wet etching, and photolithography are performed upon formation of the source-drain electrodes on the thin oxide semiconductor film. The wet etching employs a wet etchant. The photolithography employs a resist stripper so as to remove the resist and to clean the work.

For example, assume that a thin oxide semiconductor film and source-drain electrodes are formed via wet etching. In this case, the thin oxide semiconductor film is required to have two properties (A) and (B1) as follows.

(A) The thin oxide semiconductor film is required to have excellent solubility in a wet etchant for oxide semiconductor processing.

Specifically, the thin oxide semiconductor film is required to be etched at an appropriate rate by an organic acid wet etchant such as oxalic acid and to be patterned without residue, where the organic acid wet etchant is used in processing of such thin oxide semiconductor films.

(B1) The thin oxide semiconductor film is required to be insoluble in a wet etchant for source-drain electrodes.

Specifically, another wet etchant is used upon processing of an interconnection film for source-drain electrodes, where the interconnection film is deposited on the thin oxide semiconductor film. This wet etchant is exemplified by inorganic acids including phosphoric acid, nitric acid, and acetic acid. The source-drain electrodes are etched by the wet etchant at an appropriate rate. In this process, the thin oxide semiconductor film is required to resist erosion and damage by the wet etchant on the surface (back channel) side of the thin oxide semiconductor film, where the erosion and damage may cause deterioration in TFT characteristics and stress resistance.

The etching degree (etching rate) by a wet etchant varies also depending on the type of the wet etchant. The IGZO has excellent solubility in organic acid wet etchants such as oxalic acid, but also has high solubility in inorganic acid wet etchants such as phosphoric acid, nitric acid, and acetic acid, and is extremely readily etched by the inorganic acid wet etchants. Specifically, the IGZO is excellent in the property (A), i.e., wet etching characteristics upon thin oxide semiconductor film processing, but is inferior in the property (B1), i.e., durability in wet etching upon source-drain electrodes processing. Disadvantageously, the IGZO film may disappear upon source-drain electrodes processing with the wet etchant to impede the TFT formation or may cause the resulting TFT to have TFT characteristics and other properties at inferior levels. As a possible solution to solve these disadvantages, there has been studied the use of a chemical that does not etch the IGZO, such as a mixture of $NH_4F$ and $H_2O_2$, as a wet etchant for source-drain electrodes. However, this chemical (wet etchant) has a short lifetime, is unstable, and offers poor mass productivity.

The deterioration in properties such as TFT characteristics with wet etching of the source-drain electrodes, as described in the property (B1), is observed particularly in TFTs having a back channel etch (BCE) structure including no etch stopper layer, as illustrated in FIG. 1.

Specifically, structures of bottom-gate TFTs using oxide semiconductors are roughly classified into a BCE TFT structure and an ESL TFT structure. The "BCE TFT structure" refers to a back-channel etch structure including no etch stopper layer, as illustrated in FIG. 1. The "ESL TFT structure" refers to an etch-stop-layer structure including an etch stopper layer 8, as illustrated in FIG. 2.

The etch stopper layer 8 in the ESL TFT illustrated in FIG. 2 is disposed so as to eliminate or minimize deterioration in transistor characteristics caused by damage of an oxide semiconductor layer 4 upon etching of source-drain electrodes 5. The ESL TFT illustrated in FIG. 2 less suffers from damage to the semiconductor layer surface upon source-drain electrodes processing and readily offers good TFT characteristics. The etch stopper layer is generally selected from insulating films such as $SiO_2$ films.

In contrast to this, the BCE TFT illustrated in FIG. 1 does not include an etch stopper layer and offers excellent productivity, because the number of steps can be reduced to simplify the production process. Specifically, some production methods do not cause damage to the oxide semiconductor layer 4 upon etching, even when no etch stopper layer is provided. For example, when the source-drain electrodes 5 are processed by a lift-off technique, the lift-off technique does not cause damage to the oxide semiconductor layer 4, and this eliminates the need for etch stopper layers. In this case, the BCE TFT illustrated in FIG. 1 is usable. The BCE TFT illustrated in FIG. 1 is also usable upon use of a special wet etchant that is developed so as to allow the TFT to offer good TFT characteristics even when including no etch stopper layer.

From the viewpoints of TFT production cost reduction and process simplification, the BCE TFT illustrated in FIG. 1, which includes no etch stopper layer, is recommended to be used, as described above. However, the above-described disadvantages of the BCE TFT in wet etching are highly feared. Certainly, the ESL TFT illustrated in FIG. 2 may also suffer from the disadvantages caused by wet etchants of some types.

The disadvantages have been described in the property (B1) in the case where the source-drain electrodes are etched via wet etching with a wet etchant. The same disadvantages also occur in the case where the source-chain electrodes are etched via dry etching. The source-drain electrodes are formed via photolithography and etching. In this process, the disadvantages also occur when a resist stripper is used for resist removal and/or for cleaning. The resist striper is exemplified by amine-containing basic aqueous resist strippers, and non-aqueous resist strippers.

Exemplary techniques proposed to restrain damage to the oxide semiconductor layer in the BCE TFT can be found in Patent Literature 2 to 4 below. With these techniques, a sacrificial layer or a cutout is formed between the oxide semiconductor layer and the source-drain electrodes to restrain damage to the oxide semiconductor layer. The formation of the sacrificial layer or cutout, however, requires a larger number of steps. Nonpatent Literature 1 describes the removal of a damaged layer from the oxide semiconductor layer surface. However, it is difficult to uniformly remove the damaged layer.

CITATION LIST

Patent Literature

Patent Literature 1: Japanese Patent No. 4568828
Patent Literature 2: Japanese Unexamined Patent Application Publication (JP-A) No. 2012-146956
Patent Literature 3: Japanese Unexamined Patent Application Publication (JP-A) No. 2011-54812
Patent Literature 4: Japanese Unexamined Patent Application Publication (JP-A) No. 2009-4787

Nonpatent Literature

Nonpatent Literature 1: C.-J. Kim et al., Electrochem. Solid-State Lett. 12(4), H95-H97 (2009)

SUMMARY OF INVENTION

Technical Problem

The present invention has been made under these circumstances and has an object to provide a BCE TFT including no etch stopper layer, where the TFT includes a semiconductor layer derived from an oxide (oxide semiconductor) as follows. The oxide has extremely high mobility, less changes in threshold voltage due typically to light or bias stress, and has excellent stress resistance. In addition, the oxide is excellent in both the properties (A) and (B). Specifically, (A) the oxide is highly soluble in a wet etchant for oxide semiconductor processing; and (B) the oxide has excellent durability in etching and still has excellent resistance to the resist stripper when the source-drain electrodes are formed via etching (including both wet etching and dry etching) and photolithography.

The present invention has another object to provide an ESL TFT including an etch stopper layer, where the TFT includes a semiconductor layer derived from an oxide as follows. The oxide has extremely high mobility, has excellent stress resistance, and is excellent in the property (A), i.e., the oxide is highly soluble in a wet etchant for oxide semiconductor processing.

Solution to Problem

The present invention has been achieved the objects and provides a BCE TFT as a TFT according to a first embodiment. This TFT includes a substrate, and, disposed on or over the substrate in the following sequence, a gate electrode, a gate insulator film, an oxide semiconductor layer, source-drain electrodes, and a passivation film that protects the source-drain electrodes. The oxide semiconductor layer is a multilayer assembly including a first oxide semiconductor layer and a second oxide semiconductor layer. The first oxide semiconductor layer includes In, Ga, Zn, Sn, and O. The second oxide semiconductor layer includes In, Ga, Sn, and O. The second oxide semiconductor layer is disposed on or over the gate insulator film. The first oxide semiconductor layer is disposed between the second oxide semiconductor layer and the passivation film. The ratios (atomic ratios, hereinafter the same) of the individual metal elements to all the metal elements in the first oxide semiconductor layer meet conditions expressed as follows: $Ga/(In+Ga)$ is from 0.50 to 0.80, $Ga/(In+Ga+Zn+Sn)$ is from 0.15 to 0.45, and $Sn/(In+Ga+Zn+Sn)$ is from 0.05 to 0.25. The ratios in contents of the individual metal elements to the total content of all the metal elements in the second oxide semiconductor layer meet conditions expressed as follows: In/(In+Ga) is from 0.60 to 0.75, In/(In+Ga+Sn) is from 0.30 to 0.58, and Sn/(In+Ga+Sn) is from 0.15 to 0.38.

The present invention, which has been achieved the objects, also provides an ESL TFT as a TFT according to a second embodiment. This TFT includes a substrate, and, disposed on or over the substrate in the following sequence, a gate electrode, a gate insulator film, an oxide semiconductor layer, an etch stopper layer, source-drain electrodes, and a passivation film that protects the source-drain electrodes. The oxide semiconductor layer is a multilayer assembly including a first oxide semiconductor layer and a second oxide semiconductor layer. The first oxide semiconductor layer includes In, Ga, Zn, Sn, and O. The second oxide semiconductor layer includes In, Ga, Sn, and O. The second oxide semiconductor layer is disposed on or over the gate insulator film. The first oxide semiconductor layer is disposed between the second oxide semiconductor layer and the etch stopper layer. The ratios in contents of the individual metal elements to all the metal elements in the first oxide semiconductor layer meet conditions expressed as follows: Ga/(In+Ga) is from 0.50 to 0.80; Ga/(In+Ga+Zn+Sn) is from 0.15 to 0.45; and Sn/(In+Ga+Zn+Sn) is from 0.05 to 0.25. The ratios in contents of the individual metal elements to all the metal elements in the second oxide semiconductor layer meet conditions expressed as follows: In/(In+Ga) is from 0.60 to 0.75, In/(In+Ga+Sn) is from 0.30 to 0.58, and In/(In+Ga+Sn) is from 0.15 to 0.38.

In a preferred embodiment of the present invention, the second oxide semiconductor layer may have a thickness of 5 nm or more.

In a preferred embodiment of the present invention, a resist stripper may be used in etching and photolithography of a film to form the source-drain electrodes.

In a preferred embodiment of the present invention, the etching may be performed via wet etching or dry etching.

In a preferred embodiment of the present invention, the etching may be performed via wet etching using an acid etchant.

In a preferred embodiment of the present invention, the film to form the source-drain electrodes may include a film of at least one metal selected from the group consisting of Mo, Mo alloys, Ti, and Ti alloys.

In a preferred embodiment of the present invention, the film to form the source-drain electrodes may be a multilayer film that has a multilayer structure including a film of at least one metal selected from the group consisting of Mo, Mo alloys, Ti, and Ti alloys; and a film of at least one metal selected from the group consisting of Al, Al alloys, Cu, and Cu alloys, where the films are disposed in this sequence from the oxide semiconductor layer side.

The present invention also includes a display device including any of the above-described TFTs.

Advantageous Effects of Invention

The present invention can provide a BCE TFT including no etch stopper layer, where the TFT includes a semiconductor layer derived from an oxide as follows. The oxide has an extremely high mobility of 40 $cm^2/Vs$ or more and offers excellent stress resistance (has a small shift in threshold voltage between before and after the application of light and/or negative bias). In addition, the oxide has (A) excellent solubility (wet etching characteristics) in a wet etchant for oxide semiconductor processing and has (B) excellent durability in etching via wet etching using a wet etchant for source-drain electrodes or via dry etching, and still has excellent resistance to a resist stripper used in photolithography. Namely, the oxide has (B) excellent durability in etching and excellent resistance to photoresist stripper.

The present invention can also provide an ESL TFT including an etch stopper layer, where the TFT includes a semiconductor layer derived from an oxide as follows. The oxide has an extremely high mobility of 40 $cm^2/Vs$ or more and contributes to excellent switching behavior and stress resistance of the TFT. In addition, the oxide has excellent adaptability to wet etching process, namely, the oxide has (A) excellent solubility (wet etching characteristics) in a wet etchant for oxide semiconductor processing.

DESCRIPTION OF EMBODIMENTS

Figure 1:
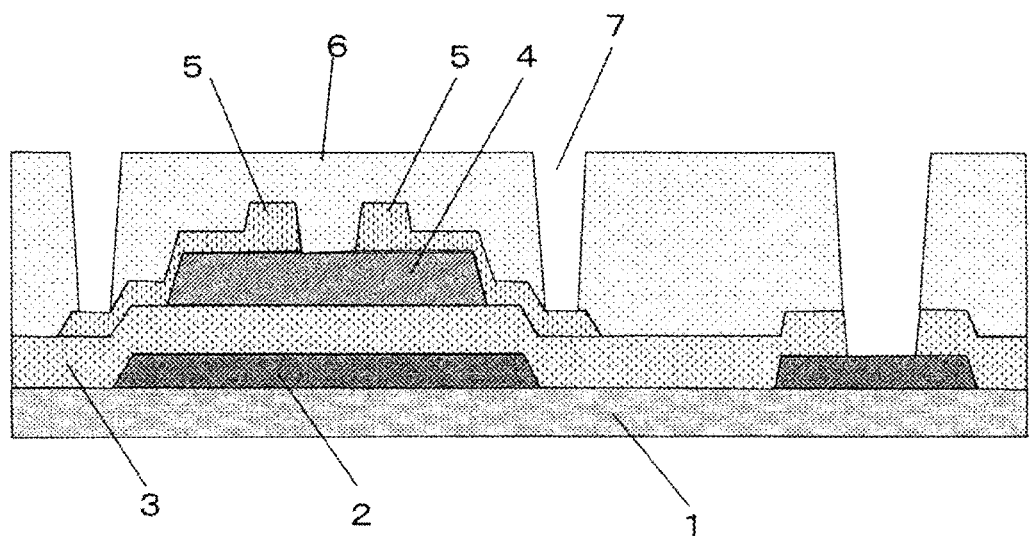
FIG. 1 is a schematic cross-sectional view of a conventional BCE TFT including an oxide semiconductor layer (as a single layer)

The inventors of the present invention made intensive investigations to achieve the objects. As a result, the inventors have found that the use of a specific multilayer assembly as an oxide semiconductor layer to be disposed between a gate insulator film and a passivation film or etch stopper layer achieves the intended objects, where the passivation film protects source-drain electrodes. The multilayer assembly includes a second oxide semiconductor layer and a first oxide semiconductor layer, disposed in this order from the gate insulator film side. The "second oxide semiconductor layer" refers to a layer derived from, as a material, an oxide of In, Ga, and Sn having predetermined metal compositional ratios. This oxide is hereinafter also briefly referred to as "IGTO". The "first oxide semiconductor layer" refers to a layer derived from, as a material, an oxide of In, Ga, Zn, and Sn having predetermined metal compositional ratios. This oxide is hereinafter also referred to as "IGZTO". The present invention has been made based on these findings.

As used herein, the term "ratios (atomic ratios) in content of the individual metal elements to all the metal elements in the first or second oxide semiconductor layer" is also simply referred to as "metal element ratio(s)".

A source electrode and a drain electrode are herein collectively referred to as "source-drain electrodes".

As used herein, the term "high mobility" refers to a mobility of 40 $cm^2/Vs$ or more when the mobility is measured by the method described in after-mentioned experimental examples.

As used herein, the term "excellent stress resistance" refers to a shift ΔVth (absolute value) in threshold voltage (Vth) of 5.0 V or less between before and after a stress application test. The stress application test is performed for 2 hours by the method described in the experimental examples, in which a negative bias is continuously applied to the gate electrode while light is applied to the sample.

As used herein, the term "(having) excellent adaptability to wet etching process" refers to "(having) both excellent wet etching characteristics (A) and excellent durability in wet etching (B1)" as mentioned below, in the case of a BCE TFT including no etch stopper layer. This term also refers to "(having) excellent wet etching characteristics (A)" as mentioned below, in the case of an ESL TFT including an etch stopper layer. Hereinafter the wet etching characteristics and the durability in wet etching are also generically referred to as "adaptability to wet etching process".

The property (A) refers to excellent wet etching characteristics, namely, excellent solubility in a wet etchant for oxide semiconductor processing.

Specifically, the property (A) means that the first and the second oxide semiconductor layers in the thin oxide semiconductor film having the multilayer structure in the present invention are etched at approximately identical etching rates (the ratio between them is from 0.1 to 4 times) by an organic acid wet etchant such as oxalic acid, and can be patterned without residue, where the organic wet etchant is used in processing of the thin oxide semiconductor film. In addition to the organic wet etchant, examples of the wet etchant for oxide semiconductor processing also include a wet etchant as a mixture of hydrochloric acid and nitric acid. Such wet etchants are also available as commercial products, such as ITO-07N (mixture of oxalic acid and water) supplied by Kanto Chemical Co., Inc.

The property (B1) refers to excellent durability in wet etching. Specifically, the property (B1) means that, when the source-drain electrodes are patterned with a wet etchant, the source-drain electrodes are etched, but the oxide semiconductor layer is insoluble in the wet etchant.

In the description, the durability in wet etching is evaluated by a method as follows, for simplification of measurement. Specifically, a first thin oxide semiconductor film alone is deposited on the substrate. Patterning with a wet etchant for source-drain electrodes is performed, and the etching rate is measured during the patterning. In this process, when the first oxide semiconductor layer is etched at an etching rate of one-half or less the etching rate of the source-drain electrodes, the sample is evaluated as having excellent durability in wet etching with the wet etchant for source-drain electrodes. A TFT having an etching rate within the range is resistant to deterioration in TFT characteristics and stress resistance due to erosion or damage of the oxide semiconductor layer surface (back channel side) by the wet etchant, because the thin oxide semiconductor film is resistant to etching by the wet etchant.

The wet etchant for source-drain electrodes for use in the present invention is not limited in type and is exemplified by acid etchants such as inorganic acid etchants typically including phosphoric acid, nitric acid, and acetic acid; inorganic acid etchants typically including sulfuric acid and nitric acid; and hydrogen peroxide etchants. For example, a mixed acid solution (PAN mixture) containing phosphoric acid, nitric acid, acetic acid, and water may be used, as described in the experimental examples. The chemical compositions (formulations) of these etchants can be adjusted as appropriate. The etchants may be selected also from commercial products such as a mixed acid etchant (mixture of phosphoric acid, nitric acid, and acetic acid) supplied by Kanto Chemical Co., Inc.

As used herein, the term "excellent durability in etching" refers to "excellent durability both in wet etching and in dry etching". As demonstrated in the experimental examples, the BCE TFT according to the present invention not only has excellent durability in wet etching, but also is free from or less suffers from film thinning when etching via dry etching is performed. This eliminates or minimizes deterioration in TFT characteristics due to etching.

As used herein, the term "excellent resistance to resist stripper" refers to "excellent resistance to a resist stripper that is used in resist stripping and cleaning in photolithography". As demonstrated in the experimental examples, the BCE TFT according to the present invention is a TFT that includes an oxide semiconductor layer having a homogeneous thickness, because the oxide semiconductor layer, as including the predetermined first oxide semiconductor layer, is not dissolved out even when the oxide semiconductor layer is exposed to a general resist stripper. This configuration eliminates or minimizes deterioration in TFT characteristics.

The resist stripper for use in the present invention is not limited in type and is exemplified by basic aqueous resist strippers, non-aqueous resist strippers, and developers for use in washing/rinsing (cleaning step) after resist stripping. Of the basic aqueous resist strippers, those containing an amine are preferably used and are exemplified by monoethanolamine and tetramethylammonium hydroxide (TMAH). Such resist strippers may also be selected from commercial products. Non-limiting examples of the commercial products are listed below. When to be used as a basic aqueous resist stripper, such a commercial product may be adjusted to give a basic (alkaline) solution having a pH of about 11 to about 14 before use. The basic aqueous resist stripper is naturally not limited to this.

Non-limiting examples of the non-aqueous resist strippers include TOK-106 and PRS-2000 (each a mixture of monoethanolamine and dimethyl sulfoxide (DMSO)) supplied by Tokyo Ohka Kogyo Co., Ltd.

Non-limiting examples of the basic aqueous resist strippers include N-321 supplied by Nagase ChemteX Corporation; NMD-W supplied by Tokyo Ohka Kogyo Co., Ltd.; AZ-300MIF supplied by AZ Electronic Materials; and PRS-2000 supplied by Dongwoo Fine-Chem Co., Ltd.

The present invention will be described in detail below, while describing what led up to the present invention.

The IGZO described typically in Patent Literature 1 has a high mobility and is useful as a material for oxide semiconductor layer. The inventors, however, made intensive investigations to provide a material that has a still higher mobility as compared with the general IGZO. As a result, the inventors found that the use of an IGTO having predetermined metal element ratios achieves a high mobility of 40 $cm^2/Vs$ or more.

The IGTO, however, may have lower stress resistance with lower stability under some process conditions, as compared with the IGZO. To eliminate or minimize this disadvantage, the inventors made still further investigations to provide an oxide semiconductor layer material that maintains the extremely high mobility obtained by the IGTO, is still less susceptible to process conditions, and has stable stress resistance.

As a result, the inventors found as follows. Assume that the IGTO is disposed in direct contact with a passivation film (in the case of BCE TFT) or an etch stopper layer (in the case of ESL TFT), where the passivation film and the etch stopper layer each includes an insulator such as $SiO_2$, $Al_2O_3$, and $HfO_2$ (these are hereinafter collectively referred to as an "oxide-based insulator"). In this case, the interface between the IGTO and the oxide-based insulator is susceptible to the formation of a trapping level caused by oxygen defects, which are due to the contact between the different materials.

The inventors made still further investigations and found that the disadvantage can be eliminated or minimized by disposing an IGZTO having predetermined metal element ratios between the IGTO and the oxide-based insulator to form a multilayer structure of the IGTO and the IGZTO. This is because the IGZTO less forms oxygen deficiency at the interface with the oxide-based insulator.

Specifically, with the present invention, an IGZTO (first oxide semiconductor layer) having predetermined metal element ratios is disposed between the oxide-based insulator and the IGTO (second oxide semiconductor layer), where the IGZTO acts as a protective layer for the IGTO. In particular, it has been verified that the first oxide semiconductor layer, as disposed as an oxide semiconductor layer that is directly exposed to various chemicals and other substances, avoids direct contact of the IGTO with the oxide-based insulator, and this restrains the formation of a trapping level caused by oxygen deficiency.

To be exact, the IGZTO constituting the first oxide semiconductor layer and the IGTO constituting the second oxide semiconductor layer differ from each other in the presence or absence of Zn, but are in common with each other in elements excluding Zn. According to the present invention, the metal element ratios of the IGZTO are appropriately controlled as described in detail below, and this can restrain the formation of a trapping level at the contact interface between the IGTO and the oxide-based insulator. Thus, the interface structure of the IGTO is stabilized.

Sufficient mobility of the entire oxide semiconductor layer (multilayer assembly) can be ensured by the IGTO constituting the second oxide semiconductor layer. Thus, even the use of the IGZTO little reduces TFT characteristics such as mobility of the entire oxide semiconductor layer. Accordingly, it is considered that the multilayer structure of the IGTO (second oxide semiconductor layer) and the IGZTO (first oxide semiconductor layer) maintains high mobility due to the presence of the IGTO and still enjoys better stress resistance due to the presence of the IGZTO.

In addition, the present invention offers excellent adaptability to wet etching process, because the multilayer structure herein does not adversely affect adaptability of the oxide semiconductor layer to wet etching process. Specifically, the oxide semiconductor layer is highly soluble in a wet etchant for oxide semiconductor processing (has excellent wet etching characteristics) in both the BCE TFT and the ESL TFT according to the present invention. When an oxide semiconductor layer is designed to have a multilayer structure, differences in types and contents of metals may cause disadvantages. For example, the first layer and the second layer differ from each other in amount of side etching during patterning of interconnections, and this impedes patterning into a desired shape. According to the present invention, however, the metal element ratios are appropriately controlled independently in the IGZTO to form the first oxide semiconductor layer and in the IGTO to form the second oxide semiconductor layer, and this allows the first oxide semiconductor layer and the second oxide semiconductor layer to be etched at approximately equivalent etching rates. This enables etching of the multilayer structure in one step, where the multilayer structure is soluble in a wet etchant for oxide semiconductor processing.

When the TFT is a BCE TFT, the first oxide semiconductor layer (IGZTO), which is in direct contact with the source-drain electrodes, is highly insoluble in a wet etchant for source-drain electrodes (has excellent durability in wet etching). Specifically, the first oxide semiconductor layer is resistant to etching by an inorganic acid wet etchant. This eliminates or minimizes deterioration in TFT characteristics and stress resistance due to erosion or damage of the oxide semiconductor layer surface (back channel) side by the wet etchant.

In the BCE TFT, the first oxide semiconductor layer (IGZTO) has excellent durability in etching regardless of etchant type and offers excellent TFT characteristics even when the source-drain electrodes are etched via dry etching. In the BCE TFT, the first oxide semiconductor layer (IGZTO) also has excellent resistance to resist stripper.

The first and second oxide semiconductor layers for use in the present invention will be illustrated in detail below.

1. First Oxide Semiconductor: IGZTO

Metal element ratios (atomic ratios) of the metal elements (In, Ga, Zn, and Sn) constituting the first oxide semiconductor layer are as follows. The ratios herein are specified mainly from the viewpoint of ensuring stress resistance, wet etching characteristics, durability in etching, and resistance to resist stripper.

(1) Ga/(In+Ga) is from 0.50 to 0.80;
(2) Ga/(In+Ga+Zn+Sn) is from 0.15 to 0.45; and
(3) Sn/(In+Ga+Zn+Sn) is from 0.05 to 0.25.

First, reasons for specifying the condition (2) will be described.

Gallium (Ga) restrains the formation of oxygen deficiency and is effective for better stress resistance. To allow the element to offer these activities effectively, the ratio of Ga to all the metal elements is controlled to be 0.15 or more as in the condition (2). The Ga ratio is preferably 0.20 or more, and more preferably 0.25 or more. However, Ga, if present in excess, may cause the sputtering target for use in deposition to have lower electric conductivity and may impede discharging by direct-current sputtering. This may cause discharge failure or abnormal discharge. In addition, such excessive Ga reduces relative amounts of In and Sn, which serve as electron conducting pathways, and this may result in lower mobility. To eliminate or minimize these, the Ga ratio is controlled in upper limit to be 0.45 or less, and preferably 0.40 or less.

Next, reasons for specifying the condition (3) will be described.

Tin (Sn) is useful for better adaptability to wet etching process, better durability in etching, and resistance to resist stripper, and higher mobility. In particular, when the present invention is applied to a BCE TFT, the BCE TFT is required to be highly insoluble in a wet etchant for source-drain electrodes. The BCE TFT is also required to have excellent durability in etching of the source-drain electrodes via dry etching and to have excellent resistance to resist stripper. According to the present invention, the Sn ratio to all the metal elements is controlled in lower limit to be 0.05 or more in consideration typically of etching selectivity. The Sn ratio is preferably 0.10 or more, and more preferably 0.15 or more. However, Sn, if present in excess, may cause deterioration in durability in etching and resistance to resist stripper and may cause deterioration in wet etching rate with respect typically to a wet etchant for oxide semiconductor processing. In particular, such excessive Sn may cause the resulting oxide to be insoluble in an organic acid such as oxalic acid and may impede the processing of the oxide semiconductor layer, where the organic acid is generally used as a wet etchant for oxide semiconductor processing. To eliminate or minimize these, the Sn ratio is controlled in upper limit to be 0.25 or less, and preferably 0.20 or less.

Next, reasons for specifying the condition (1) will be described.

According to the present invention, the Ga ratio to all the metal elements in the IGZTO constituting the first oxide semiconductor layer meets the condition (2); and the Ga ratio to In and Ga (metal elements excluding Sn and Zn) meets the condition (1). This configuration ensures high mobility and good stress resistance.

Specifically, indium (In) is effective for better conductivity of the oxide semiconductor layer and contributes to higher mobility. The conductivity is significantly affected by In and Ga. The conductivity increases with an increasing In content and decreases with an increasing Ga content, regardless of the contents of Sn and Zn. Accordingly, the ratio of Ga to the total of In and Ga (Ga/(In+Ga)) as expressed in the condition (2) is controlled in upper limit to be 0.80 or less, and is preferably 0.75 or less, and more preferably 0.72 or less. In contrast, the stress resistance is also significantly affected by Ga and In. The stress resistance increases with an increasing Ga content and decreases with an increasing In content. Accordingly, the ratio of Ga to the total of In and Ga (Ga/(In+Ga)) as expressed in the condition (2) is controlled in lower limit to be 0.50 or more, and is preferably 0.60 or more.

In a preferred embodiment of the present invention, the ratios of In and Zn to all the metal elements meet conditions as follows, provided that the metal element ratios meet the conditions (1) to (3).

In/(In+Ga+Zn+Sn) is preferably from 0.10 to 0.25; and more preferably from 0.15 to 0.20.

Zn/(In+Ga+Zn+Sn) is preferably from 0.20 to 0.60; and more preferably from 0.25 to 0.50.

2. Second Oxide Semiconductor: IGTO

Metal element ratios (atomic ratios) of the metal elements (In, Ga, and Sn) constituting the second oxide semiconductor layer are as follows. The ratios herein are specified mainly from the viewpoint of ensuring high mobility as specified in the present invention.

(4) In/(In+Ga) is from 0.60 to 0.75;
(5) In/(In+Ga+Sn) is from 0.30 to 0.58; and
(6) Sn/(In+Ga+Sn) is from 0.15 to 0.38.

First, reasons for specifying the condition (5) will be described.

Indium (In) contributes to higher mobility, as described above. To offer the high mobility specified in the present invention, the ratio of In to all the metal elements is controlled in lower limit to be 0.30 or more and is preferably 0.35 or more, and more preferably 0.40 or more. However, In, if present in an excessively high content, may cause the oxide to be a conductor. To eliminate or minimize this, the In ratio is controlled in upper limit to be 0.58 or less, and is preferably 0.55 or less, and more preferably 0.50 or less.

Next, reasons for specifying the condition (6) will be described.

Tin (Sn), if present in an excessively high content, causes In to be present in a smaller relative amount and fail to offer the high mobility as described above. To eliminate or minimize this, the Sn ratio to all the metal elements is controlled in upper limit to be 0.38 or less, and is preferably 0.35 or less, and more preferably 0.30 or less. In contrast, the lower limit of the Sn ratio is determined mainly by the relationship between the adaptability to wet etching process and the mobility. Sn contributes to better wet etching characteristics, as described above. When Sn is present in a higher content, the etching workability (etching rate) is lowered. However, the oxide semiconductor layer in the present invention includes the second oxide semiconductor layer (IGTO) as an upper layer, and the first oxide semiconductor layer (IGZTO) as an underlayer underlying the second oxide semiconductor layer. Thus, as long as the etching rate of the first oxide semiconductor is greater than the etching rate of the second oxide semiconductor layer, the etching gives a forward tapered shape and does not adversely affect adaptability to wet etching process. This is also true for dry etching. In consideration of these, the Sn ratio is controlled in lower limit to be 0.15 or more, and is preferably 0.18 or more.

Next, reasons for specifying the condition (4) will be described.

The indium (In) ratio in the IGTO for use in the present invention to form the second oxide semiconductor layer is controlled to meet the condition (5) and is still controlled to meet the condition (4) relative to the total content of In and Ga (metal elements excluding Sn). This is because as follows. Indium (In) is useful for ensuring high mobility, but Ga, if present in an excessively high content, may cause the oxide to have lower mobility. To eliminate or minimize this, it is also extremely important to control the In ratio to the total of In and Ga within an appropriate range.

To stably ensure the high mobility, the ratio of In to the total of In and Ga (In/(In+Ga)) as specified in the condition (4) is controlled in lower limit to be 0.60 or more, and is preferably 0.62 or more, and more preferably 0.65 or more. In contrast, indium (In), if present in an excessively high content, may cause the oxide to be a conductor. To restrain this, the In ratio is controlled to be 0.75 or less, and is preferably 0.73 or less, and more preferably 0.71 or less.

In a preferred embodiment of the present invention, the ratio of Ga to all the metal elements meets conditions as follows, provided that the In ratio meets the conditions (4) to (6).

Ga/(In+Ga+Sn) is preferably from 0.20 to 0.35, more preferably from 0.24 to 0.30, and furthermore preferably 0.27 or less.

The metal elements ratios in the first and second oxide semiconductor layers, which feature the present invention, have been described above.

The second oxide semiconductor layer in the present invention may have a thickness not limited. However, the second oxide semiconductor layer, if having an excessively small thickness, may cause variations in characteristics in the substrate plane (TFT characteristic such as mobility, S value, and Vth) in both of the BCE TFT and the ESL TFT. From the viewpoint of sufficiently restraining variations in the characteristics, the second oxide semiconductor layer has a thickness of preferably 5 nm or more, more preferably 10 nm or more, and furthermore preferably 20 nm or more. In contrast, the second oxide semiconductor layer, if having an excessively large thickness, may cause the entire oxide semiconductor layer to have inferior workability or may require a long time to be deposited and etched, resulting in higher production cost. To eliminate or minimize this, the second oxide semiconductor layer has a thickness of preferably 100 nm or less, and more preferably 50 nm or less.

The first oxide semiconductor layer may have any thickness both in the BCE TFT and the ESL TFT. However, the first oxide semiconductor layer, if having an excessively small thickness, may fail to offer its effects sufficiently. To eliminate or minimize this, the first oxide semiconductor layer has a thickness of preferably 20 nm or more, and more preferably 30 nm or more in both cases. In contrast, the first oxide semiconductor layer, if having an excessively large thickness, may cause the oxide semiconductor layer to have lower mobility. To eliminate or minimize this, the first oxide semiconductor layer has a thickness of preferably 50 nm or less, and more preferably 40 nm or less in both cases.

The total thickness of the second oxide semiconductor layer and the first oxide semiconductor layer may be set in an appropriate combination within the ranges, both in the BCE TFT and the ESL TFT. However, the entire oxide semiconductor layer, if having an excessively large total thickness, may cause higher production cost and/or may impede thickness reduction of the TFT. To eliminate or minimize this, the total thickness is preferably 100 nm or less, and more preferably 50 nm or less, in both cases. The lower limit of the total thickness is not limited, as long as being such a thickness as to offer effects of the first and second oxide semiconductor layers.

Figure 2:
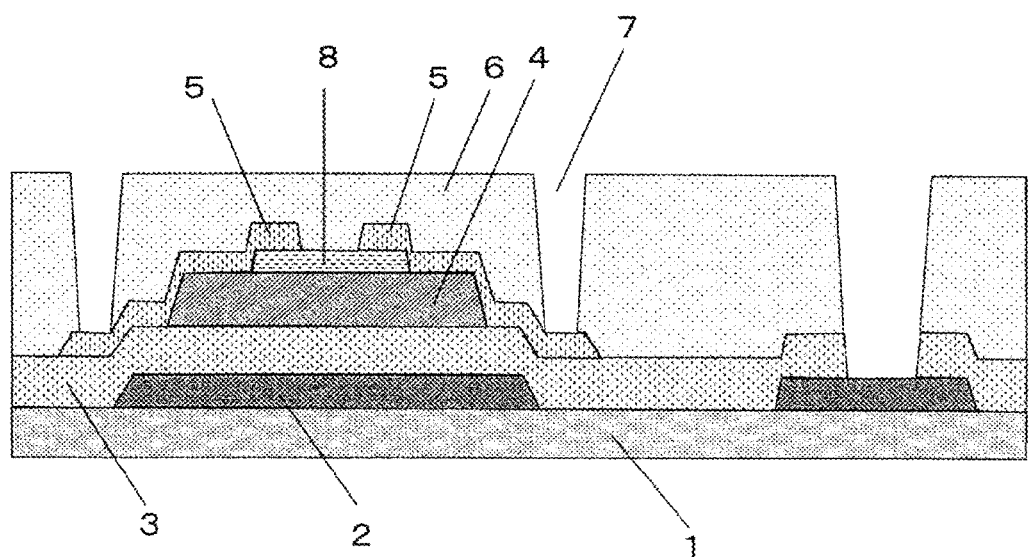
FIG. 2 is a schematic cross-sectional view of a conventional ESL TFT including an oxide semiconductor layer (as a single layer)

Next, preferred embodiments of the TFT including the oxide semiconductor layer having a multilayer structure of the first oxide semiconductor layer (IGZTO) and the second oxide semiconductor layer (IGTO) will be described, in comparisons with conventional examples. FIGS. 1 and 2 illustrate the conventional examples, and FIGS. 3 and 4 illustrate the examples according to the present invention.

The conventional examples each have a configuration as follows. The oxide semiconductor layer in these examples is composed of a second oxide semiconductor layer 4 (single layer) including IGTO, as illustrated in FIG. 1 (BCE TFT including no etch stopper layer) and FIG. 2 (ESL TFT including an etch stopper layer). In these TFTs, the second oxide semiconductor layer 4 is disposed in direct contact with a passivation film 6 (FIG. 1) or an etch stopper layer 8 (FIG. 2), and with a gate insulator film 3.

Figure 3:
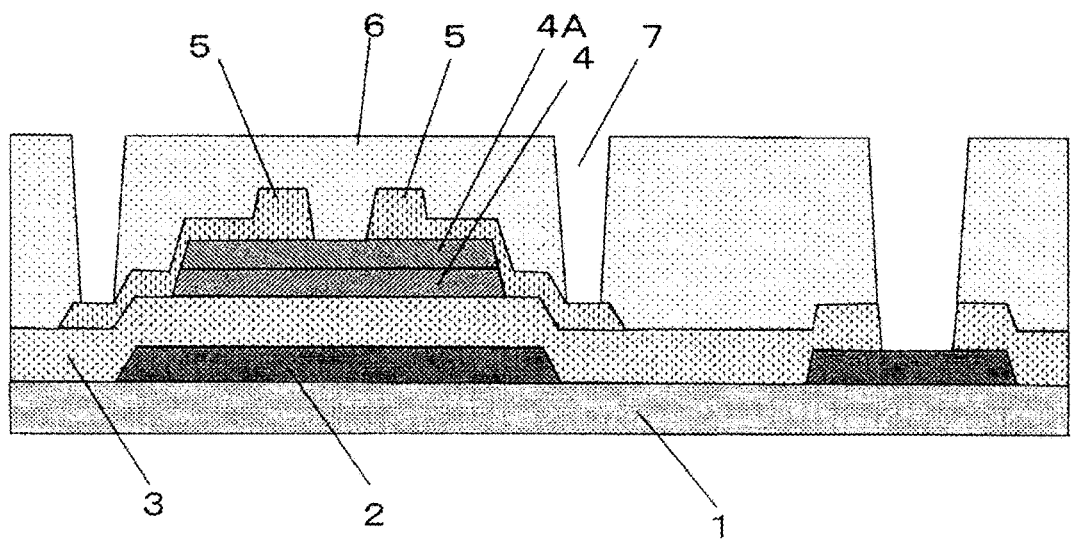
FIG. 3 is a schematic cross-sectional view of a BCE TFT including an oxide semiconductor layer for use in the present invention, where the oxide semiconductor layer is a multilayer assembly that includes a first oxide semiconductor layer (upper side when seen from the substrate side) and a second oxide semiconductor layer (lower side when seen from the substrate side)
Figure 4:
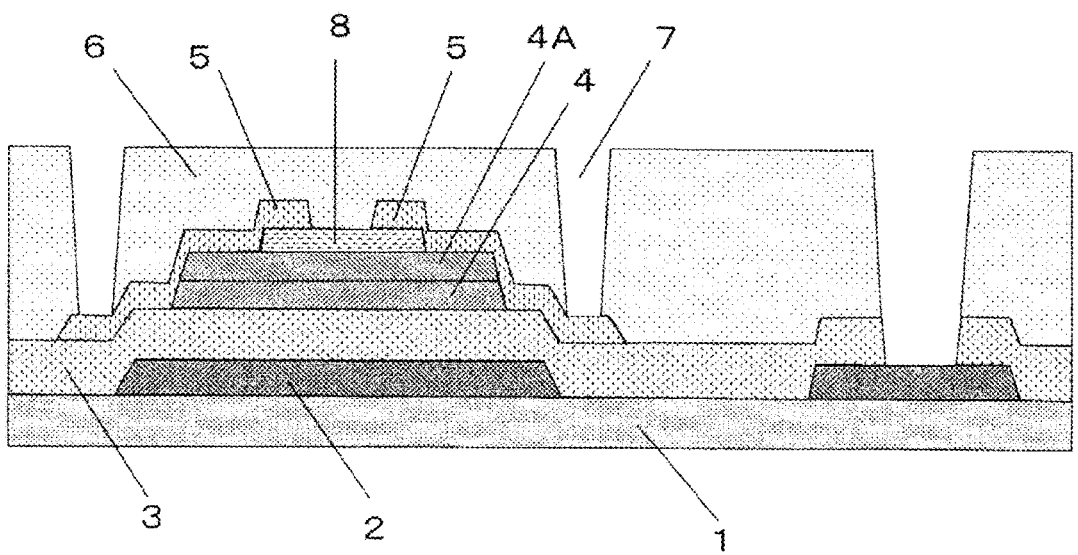
FIG. 4 is a schematic cross-sectional view of an ESL TFT including an oxide semiconductor layer for use in the present invention, where the oxide semiconductor layer is a multilayer assembly including a first oxide semiconductor layer (upper side when seen from the substrate side) and a second oxide semiconductor layer (lower side when seen from the substrate side).

FIG. 3 illustrates one preferred embodiment of the present invention, as the BCE TFT. As described above, the second oxide semiconductor layer 4 (IGTO) readily suffers from formation of a trapping level due to oxygen deficiency at the interface with the passivation film 6. To eliminate or minimize this with the present invention, the first oxide semiconductor layer 4A (IGZTO) is disposed between the second oxide semiconductor layer (IGTO) and the passivation film 6. This configuration protects the second oxide semiconductor layer from disadvantages such as the disadvantage due to oxygen deficiency, and film thinning caused by etching of the source-drain electrodes and exposure to the resist stripper in a downstream step, where the etching includes both wet etching using an etchant for source-drain electrodes, and dry etching.

In the configuration of the illustrated embodiment, the first oxide semiconductor layer 4A is disposed in direct contact with the passivation film 6, but the present invention is not limited to this configuration. For example, another layer may be disposed between the first oxide semiconductor layer 4A and the passivation film 6.

FIG. 4 illustrates another preferred embodiment of the present invention, as the ESL TFT. The first oxide semiconductor layer 4A is disposed between the second oxide semiconductor layer 4 and the etch stopper layer 8. In the configuration of the illustrated embodiment, the first oxide semiconductor layer 4A is disposed in direct contact with the etch stopper layer 8, but the present invention is not limited to this configuration. For example, another layer may be disposed between the first oxide semiconductor layer 4A and the etch stopper layer 8. The second oxide semiconductor layer 4 (IGTO) readily suffers from formation of a trapping level due to oxygen deficiency at the interface with the etch stopper layer 8. However, this disadvantage can be solved by the presence of the first oxide semiconductor layer 4A (IGZTO) between the second oxide semiconductor layer 4 (IGTO) and the etch stopper layer. Since the second oxide semiconductor layer 4 has an extremely high mobility, the high mobility can be obtained by arranging the second oxide semiconductor layer so as not to face the etch stopper layer 8, but to face the gate insulator film 3 through which a large current passes.

Next, a method for producing the oxide semiconductor layer in the present invention will be illustrated.

The second oxide semiconductor layer including the IGTO and the first oxide semiconductor layer including the IGZTO are preferably deposited via sputtering each using a sputtering target. The sputtering target is hereinafter also simply referred to as a "target". The sputtering enables easy formation of a thin film having excellent in-plane uniformity in chemical compositions and film thickness. The oxide layers may also be formed by chemical film-formation techniques such as coating.

The target for use in the sputtering is preferably a sputtering target containing the above-mentioned elements and has the same chemical composition as with the desired oxide. This enables the formation of a thin film that less suffers from compositional deviation and has the desired chemical composition. Specifically, the target for the deposition of the second oxide semiconductor layer may be selected from oxide targets (IGTO targets) including In, Ga, and Sn.

The target for the deposition of the first oxide semiconductor layer may be selected from oxide targets (IGZTO targets) including In, Ga, Zn, and Sn.

Alternatively, the deposition may be performed via co-sputtering, in which two targets having different chemical compositions are simultaneously subjected to discharging. Further alternatively, the deposition may also be performed using an oxide target as a mixture including at least two of the elements.

The target may be produced typically by powder sintering.

The second oxide semiconductor layer and the first oxide semiconductor layer, when to be deposited by sputtering, are preferably deposited successively while maintaining a vacuum state. This is because, if the second oxide semiconductor layer and the first oxide semiconductor layer are exposed to the atmosphere (air) during deposition, moisture and organic components in the air are attached to the thin film surface to cause contamination (inferior quality).

When the film deposition is performed by sputtering using the target, appropriate control is preferably made on conditions such as deposition gas pressure, amount of oxygen to be added (oxygen partial pressure), applied power to the sputtering target, substrate temperature, and T-S distance (distance between the sputtering target and the substrate). This is preferred so as to complement oxygen left from the thin film during deposition by sputtering and to allow the oxide semiconductor layer to have a density as high as possible.

Specifically, the deposition is preferably performed typically under sputtering conditions as follows.

The sputtering using the target is preferably performed while controlling the substrate temperature to be from about room temperature to about 200° C. and appropriately controlling the amount of oxygen to be added.

The amount of oxygen to be added may be appropriately controlled according typically to the sputtering equipment configuration and target chemical composition, so as to allow the resulting oxide to act as a semiconductor. Oxygen is preferably added in such an amount as to give a semiconductor carrier concentration of about $10^{15}$ to about $10^{16}$ cm$^{-3}$.

In addition, the density of the oxide semiconductor layer is preferably adjusted by appropriately controlling conditions in deposition by sputtering, such as gas pressure, applied power to the sputtering target, and T-S distance (distance between the sputtering target and the substrate). For example, the lower the total gas pressure in the deposition is, the better, to restrain scattering among sputtered atoms. This enables deposition of a dense (high-density) film. The gas pressure is preferably from about 1 to about 3 mTorr. The higher the applied power is, the better. The applied power is recommended to be set to about 200 W or more.

The conditions for heat treatment after deposition are also appropriately controlled, because these conditions also affect the density of the oxide semiconductor layer. The heat treatment after deposition is preferably performed typically in an air atmosphere or steam (moisture) atmosphere at a temperature of about 250° C. to about 400° C. for about 10 minutes to about 3 hours. Such a heat treatment can also be controlled typically via the thermal hysteresis in the TFT production process. For example, pre-annealing, when performed, allows the oxide semiconductor layer to have a higher density. The pre-annealing is a heat treatment performed after wet etching and subsequent patterning of the oxide semiconductor layer.

The present invention also includes TFTs each including a semiconductor layer constituted by (derived from) the oxides. The semiconductor layer of the TFTs has only to have a multilayer structure including the second oxide semiconductor layer and the first oxide semiconductor layer as specified in the present invention, and the gate insulator film and other configurations of the TFTs excluding the semiconductor layer are not limited. For example, assume that a TFT according to an embodiment includes a substrate, and, disposed on or over the substrate, a gate electrode, a gate insulator film, the oxide semiconductor layer, a source electrode, a drain electrode, a passivation film, and an etch stopper layer. In this embodiment, the TFT has only to include the etch stopper layer (ESL TFT), and the configurations of the TFT are not limited, as long as being those generally used. The passivation film is disposed on or over the source-drain electrodes, as illustrated in the figure. The passivation film is disposed so as to protect the gate insulator film, the oxide semiconductor layer, and the source-drain electrodes.

An embodiment of the method for producing a BCE TFT including no etch stopper layer will be illustrated below, with reference to FIG. 3. The production method as illustrated in FIG. 3 and as described below is described merely for the purpose of illustrating one of preferred embodiments of the present invention, but never intended to limit the scope of the present invention. For example, FIG. 3 illustrates a TFT having a bottom-gate structure, but the TFT is not limited to this and may also be a top-gate TFT, which includes an oxide semiconductor layer and, disposed on the oxide semiconductor layer in the following sequence, a gate insulator film and a gate electrode.

The TFT illustrated in FIG. 3 includes a substrate 1, a gate electrode 2, a gate insulator film 3, and a second oxide semiconductor layer 4. The gate electrode 2 and the gate insulator film 3 are disposed on or over the substrate 1, and the second oxide semiconductor layer 4 is disposed on the gate insulator film 3. The TFT further includes a first oxide semiconductor layer 4A, source-drain electrodes 5, and a passivation film (insulating film) 6 disposed on or over the second oxide semiconductor layer 4 sequentially in this order. In the TFT, a transparent conductive film (not shown) is electrically coupled via a contact hole 7 to the drain electrode 5.

Methods for forming the gate electrode 2 and the gate insulator film 3 on or over the substrate 1 are not limited and may be selected from generally-employed methods. The gate electrode 2 and the gate insulator film 3 are not limited in type or species and may be selected from generally-used ones. For example, the gate electrode is preferably formed from a material selected from Al, Cu, and other metals having low electrical resistivity; Mo, Cr, Ti, and other high-melting metals having good heat resistance; and alloys of these metals. Representative examples of the gate insulator film 3 include, but are not limited to, silicon nitride (SiN) films, silicon oxide (SiO$_2$) films, and silicon oxynitride (SiON) films. The gate insulator film 3 may also be selected from films of oxides such as Al$_2$O$_3$ and Y$_2$O$_3$; and laminates of them.

Next, the oxide semiconductor layers are formed. Specifically, the second oxide semiconductor layer 4 and the first oxide semiconductor layer 4A are sequentially formed in this sequence from the substrate side. The second oxide semiconductor layer 4 can also be deposited by direct-current sputtering or RF sputtering using an IGTO target. Likewise, the first oxide semiconductor layer 4A can be deposited by direct-current sputtering or RF sputtering using an IGZTO target to constitute the first oxide semiconductor layer 4A.

The second oxide semiconductor layer 4 and the first oxide semiconductor layer 4A are preferably deposited successively in a vacuum without a break. This process may be controlled so as to allow the first oxide semiconductor to have chemical compositions meeting the above-mentioned conditions. This offers higher sputtering rate and still gives better adaptability to wet etching process.

The oxide semiconductor layers are subjected to wet etching and then to patterning. As described above, the etchant for use in wet etching of the oxide semiconductor layers may be selected from those generally used in display devices and other fields. For example, the etchant may be selected from organic acid wet etchants such as oxalic acid.

Immediately after the patterning, a heat treatment (pre-annealing) is preferably performed so as to improve the quality of the oxide semiconductor layers. This treatment allows the TFT to have a higher ON-state current and higher field-effect mobility as transistor characteristics and to offer better transistor performance. The pre-annealing may be performed typically at a temperature of about 250° C. to 400° C. for a duration of about 10 minutes to one hour.

After the pre-annealing, the source-drain electrodes are formed. The source-drain electrodes 5 are not limited in type and may be selected from generally-used ones. For example, the source-drain electrodes 5 may be formed typically from metals such as Mo, Ti, Al, and Cu; and alloys of them (Mo alloys, Ti alloys, Al alloys, and Cu alloys), as with the gate electrode. Specifically, the source-drain electrodes 5 may be formed using a film (single layer) of at least one metal selected from the metals and the alloys. Alternatively, the source-drain electrodes 5 may be formed using a multilayer film including a multilayer structure of, in the following sequence from the oxide semiconductor layer side, a film of at least one metal selected from the group consisting of Mo, Mo alloys, Ti, and Ti alloys; and a film of at least one metal selected from the group consisting of Al, Al alloys, Cu, and Cu alloys. The latter multilayer film, when used, effectively contributes to reduced electric resistance.

The number of layers in the multilayer film is not limited, as long as the multilayer film has the multilayer structure. For example, the multilayer film may have the two-layer structure, or a three-layer structure further including a film of at least one metal selected from the group consisting of Mo, Mo alloys, Ti, and Ti alloys, disposed on the film of at least one metal selected from the group consisting of Al, Al alloys, Cu, and Cu alloys.

Sputtering is widely employed to form the source-drain electrodes 5. Specifically, the electrodes may be formed typically by depositing a thin metal film via magnetron sputtering; patterning the thin metal film via photolithography; and subjecting the work to wet etching or dry etching. The etchant for use in wet etching of the source-drain electrodes is not limited in type and may be selected typically from acid etchants such as inorganic acids including phosphoric acid, nitric acid, and acetic acid.

Next, the passivation film 6 is deposited on or over the oxide semiconductor layer 4A and the source-drain electrodes 5 by chemical vapor deposition (CVD). The passivation film 6 may be deposited typically using $SiO_2$, SiON, or SiN. The passivation film 6 may also be formed by sputtering. The surface of the oxide semiconductor layer 4A readily becomes conductive (has continuity) due to plasma damage by CVD. This is probably because oxygen deficiency formed in the first oxide semiconductor surface acts as an electron donor. To eliminate or minimize this, $N_2O$ plasma irradiation may be performed before the deposition of the passivation film 6. The $N_2O$ plasma irradiation may be performed typically under the conditions described in the literature:

J. Park et al., Appl. Phys. Lett., 1993, 053505 (2008).

Next, the transparent conductive film is electrically coupled via the contact hole 7 to the drain electrode 5 according to a common procedure. The transparent conductive film and the drain electrode are not limited in type and may be selected from generally-used ones. The drain electrode may be selected from those exemplified in the source-drain electrodes.

An embodiment of the method for producing an ESL TFT including an etch stopper layer will be illustrated below, with reference to FIG. 4. The production method as illustrated in FIG. 4 and as described below is described merely for the purpose of illustrating one of preferred embodiments of the present invention, but never intended to limit the scope of the present invention. For example, FIG. 4 illustrates a TFT having a bottom-gate structure, but the TFT is not limited to this and may also be a top-gate TFT, which includes an oxide semiconductor layer and, disposed on the oxide semiconductor layer in the following sequence, a gate insulator film and a gate electrode. Also in the top-gate TFT, the first oxide semiconductor layer has only to be disposed between the second oxide semiconductor layer and the etch stopper layer.

The TFT illustrated in FIG. 4 includes a substrate 1; and sequentially disposed on or over the substrate 1, a gate electrode 2, a gate insulator film 3, and a second oxide semiconductor layer 4. The TFT further includes, sequentially disposed on or over the second oxide semiconductor layer 4 in the following sequence, a first oxide semiconductor layer 4A, an etch stopper layer 8, source-drain electrodes 5, and a passivation film (insulating film) 6. In the TFT, a transparent conductive film (not shown) is electrically coupled via a contact hole 7 to the drain electrode 5.

Methods for forming the gate electrode 2 and the gate insulator film 3 on or over the substrate 1 are not limited, and may be selected from generally-employed methods. The gate electrode 2 and the gate insulator film 3 are also not limited in type, and may be selected from generally-used ones. The gate electrode is preferably formed from a material selected from Al, Cu, and other metals having low electrical resistivity; Mo, Cr, Ti, and other high-melting metals having good heat resistance; and alloys of these metals. Representative examples of the gate insulator film 3 include, but are not limited to, silicon nitride (SiN) films, silicon oxide ($SiO_2$) films, and silicon oxynitride (SiON) films. The gate insulator film 3 may also be selected from films of oxides such as $Al_2O_3$ and $Y_2O_3$; and laminates of them.

Next, the oxide semiconductor layers are formed. Specifically, the second oxide semiconductor layer 4 and the first oxide semiconductor layer 4A are sequentially formed in this order from the substrate side. The second oxide semiconductor layer 4 can be deposited by direct-current sputtering or RF sputtering using the IGTO target. Likewise, the first oxide semiconductor layer 4A can be deposited by direct-current sputtering or RF sputtering using the IGZTO target to constitute the first oxide semiconductor layer 4A.

The second oxide semiconductor layer 4 and the first oxide semiconductor layer 4A are preferably deposited successively in a vacuum without a break. This process may be controlled so as to allow the first oxide semiconductor to have chemical compositions meeting the above-mentioned conditions. This offers higher sputtering rate and still gives better adaptability to wet etching process.

The oxide semiconductor layers are subjected to wet etching and then to patterning. Immediately after the patterning, a heat treatment (pre-annealing) is preferably performed so as to improve the quality of the oxide semiconductor layers. This treatment allows the TFT to have higher ON-state current and higher field-effect mobility as transistor characteristics and to offer better transistor performance. The pre-annealing may be performed typically at a temperature of about 250° C. to 400° C. for a duration of about 10 minutes to one hour.

After the pre-annealing, the etch stopper layer 8 is formed. The etch stopper layer 8 is generally formed using an insulating film such as $SiO_2$ film. If the source-drain electrodes 5 are formed without the formation of the etch stopper layer 8, the oxide semiconductor layer may be damaged upon etching of the source-drain electrodes 5, and this may impair the transistor characteristics. The etch stopper layer 8 is not limited in type and may be selected from generally-used ones. For example, the etch stopper layer 8 may be formed typically using $SiO_2$, as with the passivation film.

The source-drain electrodes 5 are not limited in type and may be selected from those mentioned above.

Sputtering is widely used to form the source-drain electrodes 5. Specifically, the electrodes may be formed by depositing a thin metal film typically via magnetron sputtering, patterning the resulting film via photolithography, and performing wet etching or dry etching.

Next, the passivation film 6 is deposited on or over the oxide semiconductor layer 4A and the source-drain electrodes 5 by chemical vapor deposition (CVD). The passivation film 6 may be formed typically using $SiO_2$, SiON, or SiN. The passivation film 6 may also be formed via sputtering.

Next, the transparent conductive film is electrically coupled via the contact hole 7 to the drain electrode 5 according to a common procedure. The transparent conductive film and the drain electrode are not limited in type and may be selected from generally-used ones. The drain electrode may be selected typically from those exemplified in the source-drain electrodes.

The present application claims priority to Japanese Patent Application No. 2014-005363, filed Jan. 15, 2014. The entire contents of Japanese Patent Application No. 2014-005363, filed Jan. 15, 2014, are incorporated herein by reference.

EXAMPLES

The present invention will be illustrated in further detail with reference to several examples (experimental examples) below. It should be noted, however, that the examples are by no means intended to limit the scope of the invention; that various changes and modifications can naturally be made therein without deviating from the spirit and scope of the invention as described herein; and all such changes and modifications should be considered to be within the scope of the invention.

Experimental Example 1

ESL TFT

In this experimental example, ESL TFTs (FIG. 4) including oxide semiconductor layers of various types were produced and were evaluated on characteristics.

First oxide semiconductor layers were formed in this experimental example using two different IGZTOs, i.e., IGZTO "A" and IGZTO "B" given in Table 1. These IGZTOs are both examples having metal element ratios meeting the conditions specified in the present invention.

Second oxide semiconductor layers were formed in this experimental examples using a total of eleven (11) different IGZTOs, i.e., IGZTOs "a" to "k" given in Table 2. Among them, the IGZTOs "a" to "c" and "k" are examples having metal element ratios meeting the conditions specified in the present invention, and the IGZTOs "d" to "j" are examples having metal element ratios not meeting one or more of the conditions specified in the present invention.

Initially, a molybdenum (Mo) thin film having a thickness of 100 nm as a gate electrode 2 and a $SiO_2$ film having a thickness of 200 nm as a gate insulator film 3 were sequentially deposited on or over a glass substrate 1 (Corning's EAGLE 2000, 100 mm in diameter by 0.7 mm in thickness). The gate electrode 2 was deposited by direct-current sputtering using a pure molybdenum sputtering target at a deposition temperature of room temperature, a deposition power of 300 W, with a carrier gas of Ar, at a gas pressure of 2 mTorr, and an Ar gas flow rate of 20 sccm. The gate insulator film 3 was deposited by plasma CVD with a carrier gas as a gaseous mixture of $SiH_4$ and $N_2O$ at a deposition power of 1.27 W/cm$^2$, a gas pressure upon deposition of 133 Pa, and a deposition temperature of 320° C.

Next, a second oxide semiconductor layer 4 (any of IGTOs "a" to "k" given in Table 2) having a thickness of 10 nm was deposited on the gate insulator film 3 by sputtering using direct-current discharge. Specifically, three targets, i.e., $In_2O_3$, $Ga_2O_3$, and $SnO_2$ targets, were arranged around the substrate, and the second oxide semiconductor layer was deposited on the substrate standing still by direct-current sputtering.

The deposition technique as above allows the IGTO to have a compositional ratio varying depending on the position of the substrate. Specifically, ratios of elements constituting a target decrease with an increasing distance from the target. For example, the ratio of In to Ga to Sn (In:Ga:Sn) in chemical composition is 65:30:5 at a position near to the $In_2O_3$ target (Sample No. 7 in Table 4); but is 43:27:30 at the center of the substrate (Sample No. 1 in Table 4).

Such deposition technique has been established as a technique for investigating an optimum compositional ratio.

Successively, a first oxide semiconductor layer 4 (any of IGZTOs "A" and "B" given in Table 1) having a thickness of 30 nm was deposited by sputtering using direct-current discharge. Specifically, four targets, i.e., $In_2O_3$, $Ga_2O_3$, ZnO, and $SnO_2$ targets, were arranged around the substrate, and the first oxide semiconductor layer was deposited on the substrate standing still by direct-current sputtering.

The deposition technique as above allows the IGZTO to have a compositional ratio varying depending on the position in the substrate. Specifically, the ratios of elements constituting a target decrease with an increasing distance from the target. For example, the ratio of In to Ga to Zn to Sn (In:Ga:Zn:Sn) in chemical composition is 17:40:33:10 at a position near to the $Ga_2O_3$ target (Symbol A in Table 1); and is 17:17:47:19 at a position near to the ZnO target (Symbol B in Table 1).

The sputtering procedures of the first and second oxide semiconductor layers were performed both using equipment CS-200 supplied by ULVAC, Inc. under conditions as follows:

Substrate temperature: room temperature
Gas pressure: 1 mTorr
Oxygen partial pressure: $O_2/(Ar+O_2)=4\%$
Deposition power density: 2.55 W/cm$^2$ The depositions of the second oxide semiconductor layer 4 and the first oxide semiconductor layer 4A were performed successively without exposure of the chamber to the atmosphere during the process.

The contents of metal elements in the oxide semiconductor layers obtained in the above manner were analyzed by X-ray photoelectron spectroscopy (XPS). As a result, the first and second oxide semiconductor layers were found to have metal element ratios identical to the metal element ratios in the oxide sputtering targets used for deposition.

The second oxide semiconductor layer 4 and the first oxide semiconductor layer 4A were both deposited via direct-current sputtering. The sputtering was performed using equipment CS-200 supplied by ULVAC, Inc. under conditions as follows:

Substrate temperature: room temperature
Gas pressure: 1 mTorr
Oxygen partial pressure: $O_2/(Ar+O_2)\times100=4\%$
Deposition power density: 2.55 W/cm$^2$ After depositing the oxide semiconductor layers in the above manner, patterning was performed via photolithography and wet etching. (i) A wet etchant used herein was ITO-07N supplied by Kanto Chemical Co., Inc.

After patterning of the oxide semiconductor layers, pre-annealing was performed so as to improve the film quality. The pre-annealing was performed at 350° C. in an air atmosphere for one hour.

Next, a silicon oxide ($SiO_2$) film having a thickness of 100 nm was deposited as an etch stopper layer 8 on the channel layer (oxide semiconductor layer). Specifically, the etch stopper layer 8 was deposited via plasma CVD at a substrate temperature of 200° C. and a deposition power of 100 W with a carrier gas as a gaseous mixture of $SiH_4$ and $N_2O$. The etch stopper layer 8 was deposited using the same equipment as with the gate insulator film.

Next, a pure molybdenum (Mo) film having a thickness of 200 nm was deposited as source-drain electrodes 5 on the oxide semiconductor layer. Specifically, the source-drain electrodes 5 were deposited by direct-current sputtering using a pure Mo sputtering target at a deposition temperature of room temperature and a deposition power of 300 W, with a carrier gas of Ar, at a gas pressure of 2 mTorr, an Ar gas flow rate of 20 sccm, and a substrate temperature of room temperature. Next, the Mo electrodes were patterned via photolithography and wet etching. A wet etchant used herein was the mixed acid etchant (a mixture of phosphoric acid, nitric acid, and acetic acid) supplied by Kanto Chemical Co., Inc. Next, unnecessary photoresist was removed using Stripper 106 supplied by Tokyo Ohka Kogyo Co., Ltd. so as to allow the resulting TFT to have a channel length of 20 μm and a channel width of 210 μm.

After forming the source-drain electrodes 5 in the above manner, a passivation film 6 was deposited so as to protect the oxide semiconductor TFT. Specifically, a $SiO_2$ film having a thickness of 100 nm, and a SiN film having a thickness of 100 nm were sequentially deposited as the passivation film 6. The deposition of the $SiO_2$ and SiN films was performed via plasma CVD using PD-220NL supplied by SAMCO Inc. In this experimental example, the $SiO_2$ film and SiN film were sequentially deposited after performing plasma treatment with $N_2O$ gas.

The $SiO_2$ film was deposited using a gaseous mixture of $N_2O$ and $SiH_4$; and the SiN film was deposited using a gaseous mixture of $SiH_4$, $N_2$, and $NH_3$. In any case, the deposition was performed at a deposition power of 100 W and a deposition temperature of 150° C.

Next, a contact hole 7 was formed in the passivation film 6 via photolithography and dry etching. The contact hole 7 was formed for probing for evaluation of transistor characteristics.

The transistor characteristics of the TFTs prepared in the above manner were evaluated under conditions as follows. The transistor characteristics to be evaluated are threshold voltage Vth, field-effect mobility ($\mu_{FE}$), and resistance to stress caused by light irradiation and negative bias application.

(1) Transistor Characteristics Measurement

The transistor characteristics were measured using the semiconductor parameter analyzer HP4156C supplied by Agilent Technologies. Detailed measurement conditions are as follows:

Source voltage: 0 V
Drain voltage: 10 V
Gate voltage: −30 to 30 V (measurement interval: 0.25 V)
Substrate temperature: room temperature (2) Field-Effect Mobility μFE The field-effect mobility μFE was derived from the TFT characteristics in a saturated region where $V_d>(Vg-V_T)$. The μFE is derived from Expression (1) below. In Expression (1), in the saturated region, $V_g$ and $V_T$ respectively represent the gate voltage and the threshold voltage; $I_d$ represents the drain current; L and W respectively represent the channel length and the channel width of the TFT element; $C_i$ represents the capacitance of the gate insulator film; and μFE represents the field-effect mobility. In this experimental example, the field-effect mobility μFE was derived from the drain current-gate voltage characteristics ($I_d$-$V_g$ characteristics) adjacent to the gate voltage meeting the condition of the saturated region. In this experimental example, a sample having a mobility of equal to or greater than 4 0 $cm^2$/Vs was evaluated as accepted and as having high mobility (indicated as "high" in the tables), and a sample having a mobility of less than 4 0 $cm^2$/Vs was evaluated as rejected and as having low mobility (indicated as "low" in the tables).

[Math. 1]

$$\mu_{FE} = \frac{\partial I_d}{\partial V_g}\left(\frac{L}{C_i W(V_g - V_{th})}\right) \quad \text{Expression (1)}$$

(3) Stress Resistance

A stress application test was performed in this experimental example. In the stress application test, light (white light) was applied while applying a negative bias to the gate electrode. The stress application was performed under conditions mentioned below. The selected light wavelength was about 400 nm, which wavelength is near to the oxide semiconductor band gap and at which the transistor characteristics are readily varied.

Gate voltage: −20 V
Substrate temperature: 60° C.
Light Stress
Wavelength: 400 nm
Illuminance (intensity of light applied to the TFT): 0.1 μW/$cm^2$
Light source: LED supplied by OptoSupply Ltd. (the light quantity was adjusted using an ND filter)
Stress application time: 2 hours In this experimental example, a variation of the threshold voltage during the stress application for 2 hours was defined as the threshold voltage shift ΔVth and used as an index for stress resistance in the TFT characteristics. A sample having a ΔVth (absolute value) of 5.0 V or less was evaluated as having excellent stress resistance in the present invention.

In addition, the adaptability to wet etching process was evaluated in this experimental example by a procedure as follows.

(4) Evaluation of Adaptability to Wet Etching Process

For simplified measurement in this experimental example, the adaptability to wet etching process was evaluated in the following manner while depositing the oxide semiconductor layer by the TFT production method, except that the oxide semiconductor layer had not a multilayer structure, but a single layer structure of the first or second oxide semiconductor layer alone.

Specifically, in the TFT production method in this experimental example, the first oxide semiconductor layer ("A" or "B" in Table 1) or the second oxide semiconductor layer (any of "a" to "k" in Table 2) was deposited on a glass substrate. Next, each of the oxide semiconductor layers prepared in the above manner was immersed for etching in an etchant for oxide semiconductor processing (ITO-07N supplied by Kanto Chemical Co., Inc.) at an etchant temperature of room temperature. The change in thickness (etched amount) of each oxide semiconductor layer between before and after the etching was measured, and the etching rate was calculated based on the relationship with the etching time.

As a result, the etching rate in samples using IGZTO "A" (Table 1) to form the first oxide semiconductor layer was 26 nm/min., and the etching rate in samples using IGZTO "B" (Table 1) to form the first oxide semiconductor layer was 27 nm/min.

A sample having a ratio (etching rate ratio) of the etching rate of the second oxide semiconductor layer (any of IGTO "a" to "k" in Table 2) to the etching rate of the first oxide semiconductor layer (IGZTO "A" or "B" in Table 1) of 0.1 to 4 (times) was evaluated as having good wet etching characteristics to the wet etchant for oxide semiconductor processing; and a sample having an etching rate ratio out of the range was evaluated as having poor wet etching characteristics to the wet etchant for oxide semiconductor processing.

The results are presented in Tables 3 to 5. In "overall judgment" in Tables 4 and 5, a sample evaluated as being good all in the characteristics was evaluated as "accepted", and a sample evaluated as being poor in at least one of the characteristics was evaluated as "rejected". The mobility values are also presented in some samples in Tables 4 and 5.

TABLE 1

| | First oxide semiconductor | | | | | | |
|---|---|---|---|---|---|---|---|
| Symbol | In | Ga | Zn | Sn | Ga/(In + Ga) | Ga/(In + Ga + Zn + Sn) | Sn/(In + Ga + Zn + Sn) |
| A | 17 | 40 | 33 | 10 | 0.70 | 0.40 | 0.15 |
| B | 17 | 17 | 47 | 19 | 0.50 | 0.32 | 0.19 |

TABLE 2

| | Second oxide semiconductor | | | | | |
|---|---|---|---|---|---|---|
| Symbol | In | Ga | Sn | In/(In + Ga) | In/(In + Ga + Sn) | Sn/(In + Ga + Sn) |
| a | 43 | 27 | 30 | 0.61 | 0.43 | 0.30 |
| b | 50 | 32 | 18 | 0.61 | 0.50 | 0.18 |
| c | 39 | 24 | 37 | 0.62 | 0.39 | 0.37 |
| d | 60 | 22 | 18 | 0.73 | 0.60 | 0.18 |
| e | 30 | 45 | 25 | 0.40 | 0.30 | 0.25 |
| f | 53 | 40 | 7 | 0.57 | 0.53 | 0.07 |
| g | 65 | 30 | 5 | 0.68 | 0.65 | 0.05 |
| h | 40 | 10 | 50 | 0.80 | 0.40 | 0.50 |
| i | 40 | 20 | 40 | 0.67 | 0.40 | 0.40 |
| j | 65 | 20 | 15 | 0.76 | 0.65 | 0.15 |
| k | 57 | 24 | 19 | 0.70 | 0.57 | 0.19 |

TABLE 3

| No. | First oxide semiconductor Symbol in Table 1 | Second oxide semiconductor Symbol in Table 2 | In | Ga | Sn | In/(In + Ga) | In/(In + Ga + Sn) | Sn/(In + Ga + Sn) | Mobility cm$^2$/Vs | ΔVth (V) |
|---|---|---|---|---|---|---|---|---|---|---|
| 1 | None | a | 43 | 27 | 30 | 0.61 | 0.43 | 0.30 | 63 | −7.5 |
| 2 | A | a | 43 | 27 | 30 | 0.61 | 0.43 | 0.30 | 48 | −1.5 |

TABLE 4

| No. | First oxide semiconductor Symbol in Table 1 | Second oxide semiconductor Symbol in Table 2 | In | Ga | Sn | In/(In + Ga) | In/(In + Ga + Sn) | Sn/(In + Ga + Sn) | Mobility cm$^2$/Vs | ΔVth (V) | Etchant for oxide semiconductor processing Ratio to IGZTO | Overall judgment |
|---|---|---|---|---|---|---|---|---|---|---|---|---|
| 1 | A | a | 43 | 27 | 30 | 0.61 | 0.43 | 0.30 | High (48) | −1.5 | Good | Accepted |
| 2 | A | b | 50 | 32 | 18 | 0.61 | 0.50 | 0.18 | High | −3.5 | Good | Accepted |
| 3 | A | c | 39 | 24 | 37 | 0.62 | 0.39 | 0.37 | High | −3.25 | Good | Accepted |
| 4 | A | d | 60 | 22 | 18 | 0.73 | 0.60 | 0.18 | High (58) | −7.25 | Good | Rejected |
| 5 | A | e | 30 | 45 | 25 | 0.40 | 0.30 | 0.25 | Low | −1 | Good | Rejected |
| 6 | A | f | 53 | 40 | 7 | 0.57 | 0.53 | 0.07 | Low | −3.25 | Good | Rejected |
| 7 | A | g | 65 | 30 | 5 | 0.68 | 0.65 | 0.05 | High | −8.5 | Good | Rejected |
| 8 | A | h | 40 | 10 | 50 | 0.80 | 0.40 | 0.50 | Low | −7.5 | Poor | Rejected |
| 9 | A | i | 40 | 20 | 40 | 0.67 | 0.40 | 0.40 | Low | −4.5 | Poor | Rejected |
| 10 | A | j | 65 | 20 | 15 | 0.76 | 0.65 | 0.15 | High | −9.5 | Good | Rejected |
| 11 | A | k | 57 | 24 | 19 | 0.70 | 0.57 | 0.19 | High | −4.25 | Good | Accepted |

TABLE 5

| No. | First oxide semiconductor Symbol in Table 1 | Second oxide semiconductor | | | | | | Mobility cm²/Vs | ΔVth (V) | Etchant for oxide semiconductor processing Ratio to IGZTO | Overall judgment |
|---|---|---|---|---|---|---|---|---|---|---|---|
| | | Symbol in Table 2 | In | Ga | Sn | In/(In + Ga) | In/(In + Ga + Sn) | Sn/(In + Ga + Sn) | | | | |
| 1 | B | a | 43 | 27 | 30 | 0.61 | 0.43 | 0.30 | High | −2.5 | Good | Accepted |
| 2 | B | c | 39 | 24 | 37 | 0.62 | 0.39 | 0.37 | High | −4.75 | Good | Accepted |
| 3 | B | d | 60 | 22 | 18 | 0.73 | 0.60 | 0.18 | High | −10.5 | Good | Rejected |
| 4 | B | e | 30 | 45 | 25 | 0.40 | 0.30 | 0.25 | Low | −2.5 | Good | Rejected |
| 5 | B | j | 65 | 20 | 15 | 0.76 | 0.65 | 0.15 | High | −13.5 | Good | Rejected |
| 6 | B | k | 57 | 24 | 19 | 0.70 | 0.57 | 0.19 | High | −5.0 | Good | Accepted |

First, data in Table 3 will be discussed.

Sample No. 1 in Table 3 is a sample including the second oxide semiconductor layer ("a" in Table 2) (thickness: 40 nm) alone as the oxide semiconductor layer. As demonstrated in Table 3, this sample had a high mobility, but poor stress resistance.

In contrast, Sample No. 2 in Table 3 is a sample including, as the oxide semiconductor layer, a multilayer structure including the second oxide semiconductor layer ("a" in Table 2) and the first oxide semiconductor layer ("A" in Table 1) disposed on the second oxide semiconductor layer. As demonstrated in Table 3, Sample No. 2 had a somewhat lower mobility as compared with Sample No. 1, but still maintained a high mobility of 40 cm²/Vs or more, and offered significantly better stress resistance.

Next, data in Table 4 will be discussed.

Table 4 presents samples each including a multilayer structure including any of oxides "a" to "k" in Table 2 as the second oxide semiconductor layer, and disposed thereon, the first oxide semiconductor layer ("A" in Table 1).

Samples Nos. 1 to 3 and 11 in Table 4 are samples including any of the second oxide semiconductor layers "a" to "c", and "k" as specified in the present invention and were good in all of the mobility, stress resistance, and wet etching characteristics.

In contrast, Samples Nos. 4 to 10 in Table 4 have disadvantages as follows.

Sample No. 4 in Table 4 is a sample using the oxide "d" in Table 2 to form the second oxide semiconductor layer, where the oxide "d" had an indium ratio to all the metal elements of greater than the upper limit specified in the present invention. As a result, this sample had a higher mobility, but lower stress resistance as compared with Sample No. 1 in Table 4.

Sample No. 5 in Table 4 is a sample using the oxide "e" in Table 2 to form the second oxide semiconductor layer, where the oxide "e" had an indium (In) ratio to the total of In and Ga of lower than the lower limit specified in the present invention. This sample had a lower mobility due to excessively low In ratio.

Sample No. 6 in Table 4 is a sample using the oxide "f" in Table 2 to form the second oxide semiconductor layer, where the oxide "f" had an indium ratio to the total of In and Ga and a Sn ratio to all the metal elements of lower than the lower limits specified in the present invention. Consequently, the sample had a lower mobility.

Sample No. 7 in Table 4 is a sample using the oxide "g" in Table 2 to form the second oxide semiconductor layer, where the oxide "g" had an indium ratio to all the metal elements of greater than the upper limit specified in the present invention and had a Sn ratio to all the metal elements of lower than the lower limit specified in the present invention. Consequently, the sample had lower stress resistance.

Sample No. 8 in Table 4 is a sample using the oxide "h" in Table 2 to form the second oxide semiconductor layer, where the oxide "h" had an indium ratio to the total of In and Ga of greater than the upper limit specified in the present invention and had a Sn ratio to all the metal elements of greater than the upper limit specified in the present invention. Consequently, the sample had mobility, stress resistance, and wet etching characteristics all at lower levels.

Sample No. 9 in Table 4 is a sample using the oxide "i" in Table 2 to form the second oxide semiconductor layer, where the oxide "i" had a Sn ratio to all the metal elements of greater than the upper limit specified in the present invention. Consequently, the sample had mobility and wet etching characteristics at lower levels.

Sample No. 10 in Table 4 is a sample using the oxide "j" in Table 2 to form the second oxide semiconductor layer. The oxide "j" had an indium ratio to the total of In and Ga of greater than the upper limit specified in the present invention and had an indium ratio to all the metal elements of greater than the upper limit specified in the present invention. Consequently, the sample had lower stress resistance.

Next, data in Table 5 will be discussed.

Table 5 presents samples including a multilayer structure including a second oxide semiconductor layer formed from any of the oxides "a", "c" to "e", "j", and "k" in Table 2, and a first oxide semiconductor layer ("B" in Table 1) disposed on the second oxide semiconductor layer.

Samples Nos. 1, 2, and 6 in Table 5 are samples using any of the oxides "a", "c", and "k" meeting conditions specified in the present invention to form the second oxide semiconductor layer. These samples had mobility, stress resistance, and wet etching characteristics all at good levels.

In contrast, Samples Nos. 3 to 5 in Table 5 have disadvantages as follows.

Sample No. 3 in Table 5 is a sample using the oxide "d" in Table 2 to form the second oxide semiconductor layer, where the oxide "d" had an indium ratio to all the metal elements of greater than the upper limit specified in the present invention. Consequently, the sample had lower stress resistance.

Sample No. 4 in Table 5 is a sample using the oxide "e" in Table 2 to form the second oxide semiconductor layer. The oxide "e" had an indium ratio to all the metal elements of less than the lower limit specified in the present invention. Consequently, the sample had a higher mobility, but lower stress resistance, as compared with Sample No. 1 in Table 4.

Sample No. 5 in Table 5 is a sample using the oxide "j" in Table 2 to form the second oxide semiconductor layer. The oxide "j" had an indium ratio to the total of In and Ga of greater than the upper limit specified in the present invention and had an indium ratio to all the metal elements of greater than the upper limit specified in the present invention. Consequently, the sample had lower stress resistance.

Experimental Example 2

BCE TFT

In this experimental example, the etching rate of each oxide semiconductor layer by a resist stripper was measured to evaluate resistance to resist stripper. For simplified measurement, the oxide semiconductor layer was deposited not to have a multilayer structure, but to have a single layer structure of a first oxide semiconductor layer alone. The etching rate was measured in a manner as follows.

Two different IGZTOs "A" and "B" in Table 6 were used to form the first oxide semiconductor layer. These are oxides meeting conditions in metal element ratios specified in the present invention and are the same as the IGZTOs "A" and "B" in Table 1. For comparison, an IGZO "C" (including no Sn, having an atomic ratio of In:Ga:Zn of 1:1:1) as given in Table 6 was used to form the first oxide semiconductor layer.

TABLE 6

| | First oxide semiconductor | | | | | | |
|---|---|---|---|---|---|---|---|
| Symbol | In | Ga | Zn | Sn | Ga/(In + Ga) | Ga/(In + Ga + Zn + Sn) | Sn/(In + Ga + Zn + Sn) |
| A | 17 | 40 | 33 | 10 | 0.70 | 0.40 | 0.15 |
| B | 17 | 17 | 47 | 19 | 0.50 | 0.32 | 0.19 |
| C | 33.3 | 33.3 | 33.3 | 0 | 0.50 | 0.50 | 0.00 |

The resist stripper used herein was selected from two resist strippers "A" and "B" as follows.

The resist stripper "A" was TOK-106 supplied by Tokyo Ohka Kogyo Co., Ltd. as an organic non-aqueous resist stripper. This was used at a stripper temperature of 70° C.

The resist stripper "B" was N-321 supplied by Nagase ChemteX Corporation adjusted to a pH of 13, as a basic aqueous resist stripper. This was used at a stripper temperature of 40° C.

Initially, any of the oxides "A" to "C" in Table 6 was deposited on a glass substrate (Corning's EAGLE XG, 100 mm in diameter by 0.7 mm in thickness) to form the first oxide semiconductor layer having a thickness of 40 nm. Specifically, the deposition was performed under conditions as follows:

Deposition technique: sputtering using direct-current discharge
Sputtering equipment: CS-200 supplied by ULVAC, Inc.
Sputtering Conditions
Substrate temperature: room temperature
Gas pressure: 1 mTorr
Oxygen partial pressure: $O_2/(Ar+O_2)$=4%
Deposition power density: 2.55 W/cm$^2$ Next, pre-annealing was performed to improve the film quality of each oxide semiconductor layer. The pre-annealing was performed at 350° C. in an air atmosphere for 60 minutes. Subsequently, a region to be immersed in the resist stripper, and a region not to be immersed in the resist stripper were formed using a masking tape (Kapton Tape). Each oxide semiconductor layer treated in the above manner was immersed in the resist stripper "A" or "B", and the amount of reduction of thickness (reduction in thickness, film thinning) of each oxide semiconductor layer reduced by etching at a constant etching rate was measured using a stylus profiler (Alpha-Step, supplied by KLA-Tencor). Specifically, the etching rate (nm/min) of each oxide semiconductor layer was measured in a manner as follows. The etching rate is also simply referred to as "E/R".

In this experimental example, a sample having an etching rate (E/R) (nm/min) of the oxide semiconductor layer measured in the above manner of less than 1.0 nm/min was evaluated as being accepted (as having excellent resistance to resist stripper). This criterion is determined because a work is generally immersed in a resist stripper for about 10 minutes or longer and the work, if having an etching rate E/R of 1.0 nm/min or more, may suffer from a film thinning of 10 nm or more, and this may cause the TFT to have lower TFT characteristics.

The results are presented in Table 7.

TABLE 7

| No. | First oxide semiconductor Symbol in Table 6 | Resist stripper | Etching rate nm/min |
|---|---|---|---|
| 1 | A | A | 0 |
| 2 | A | B | 0.2 |
| 3 | B | A | 0 |
| 4 | B | B | 0 |
| 5 | C | A | 0 |
| 6 | C | B | 1.0 |

Samples Nos. 1 to 4 in Table 7 are samples each using the oxide ("A" or "B" in Table 6) meeting the conditions specified in the present invention to form the first oxide semiconductor layer as the oxide semiconductor layer. These samples had a low etching rate E/R regardless of resist stripper type, demonstrating that the samples had excellent resistance to resist stripper.

In contrast, Samples Nos. 5 and 6 in Table 7 are samples using the conventional IGZO ("C" in Table 6) to form the oxide semiconductor layer. The samples using the IGZO had resistance to resist stripper varying depending on resist stripper type. These samples were etched at a low etching rate E/R by the resist stripper "A", but were etched at a significantly high etching rate E/R by the resist stripper "B".

The results demonstrated that the first oxide semiconductor layer as specified in the present invention, when used as an oxide semiconductor layer portion exposed to resist strippers, can offer good resistance to resist stripper regardless of resist stripper type, in contrast to the IGZO.

Experimental Example 3

BCE TFT

In this experimental example, BCE TFTs including various oxide semiconductor layers were produced and evaluated on characteristics. This experimental example employed the oxides "A" to "C" in Table 7 to form the first oxide semiconductor layer and the oxide IGTO "a" in Table 2 to form the second oxide semiconductor. The source-drain electrodes were etched herein using a wet etchant.

Initially, a molybdenum (Mo) thin film having a thickness of 100 nm as a gate electrode 2, and a $SiO_2$ film having a thickness of 250 nm as a gate insulator film 3 were sequentially deposited on or over a glass substrate 1 (Corning's EAGLE XG, 100 mm in diameter by 0.7 mm in thickness). The gate electrode 2 was deposited by direct-current sputtering using a pure molybdenum (Mo) sputtering target at a deposition temperature of room temperature, a deposition power of 300 W, with a carrier gas of Ar, and at a gas pressure of 2 mTorr. The gate insulator film 3 was deposited by plasma CVD, with a carrier gas as a gaseous mixture of $SiH_4$ and $N_2O$, at a deposition power of 1.27 W/cm², a gas pressure upon deposition of 133 Pa, and a deposition temperature of 320° C.

Next, a second oxide semiconductor layer 4 (IGTO "a" in Table 2) having a thickness of 10 nm was deposited on the gate insulator film 3 by sputtering using direct-current discharge. Successively, a first oxide semiconductor layer (any of "A", "B", and "C" in Table 1) having a thickness of 30 nm was deposited by sputtering using direct-current discharge. The oxide semiconductor layer 4 was deposited via direct-current sputtering. The sputtering was performed using the equipment CS-200 supplied by ULVAC, Inc. under conditions as follows:

Sputtering Conditions
Substrate temperature: room temperature
Gas pressure: 1 mTorr
Oxygen partial pressure: $O_2/(Ar+O_2)=4\%$
Deposition power density: 2.55 W/cm²

The depositions of the second oxide semiconductor layer and the first oxide semiconductor layer were performed successively without exposure of the chamber to the atmosphere during the process. The contents of metal elements in the oxide semiconductor layers prepared in the above manner were analyzed by X-ray photoelectron spectroscopy (XPS). As a result, the first and second oxide semiconductor layers were found to have metal element ratios identical to the metal element ratios in the oxide sputtering targets used for deposition.

After deposition of the oxide semiconductor layer 4 in the above manner, patterning was performed via photolithography and wet etching. The wet etching was performed using an acid etchant (wet etchant) ITO-07N (mixture of oxalic acid and water) supplied by Kanto Chemical Co., Inc. It was verified in this experimental example that all the tested oxide thin films did not leave a residue due to wet etching and were appropriately etched.

After patterning the oxide semiconductor layers in the above manner, pre-annealing was performed so as to improve the quality of the oxide semiconductor layers. The pre-annealing was performed at 350° C. in an air atmosphere for 60 minutes.

Next, source-drain electrodes (S/D electrodes) were formed. A pure molybdenum film having a thickness of 100 nm was deposited herein by direct-current sputtering, and was then patterned via photolithography and wet etching, as with the gate electrode. The wet etching was performed using an acid etchant of a mixed acid (PAN) having a ratio (volume ratio) of phosphoric acid to nitric acid to acetic acid to water of 70:1.9:10:12, at an etchant temperature of room temperature. The patterning was performed so as to allow the resulting TFT to have a channel length of 10 μm and a channel width of 200 μm. The work was further immersed (overetched) in the acid etchant for a duration corresponding to 50% of the thickness of the source-drain electrodes, so as to eliminate or minimize a short circuit of the source-drain electrodes and to surely perform the patterning. The resist was then removed using the resist stripper "A" or the resist stripper "B".

Subsequently, a $SiO_2$ film having a thickness of 100 nm and a SiN film having a thickness of 100 nm were sequentially formed as a passivation film. The passivation film was deposited by plasma CVD using PD-220NL supplied by SAMCO Inc. In this experimental example, the $SiO_2$ film was deposited after a pretreatment, i.e., a plasma treatment with $N_2O$ gas for 60 seconds. The plasma treatment using $N_2O$ gas in this process was performed at a power of 100 W, a gas pressure of 133 Pa, and a treatment temperature of 200° C. for a duration of one minute. The deposition of the $SiO_2$ film was performed using a gaseous mixture of $SiH_4$ and $N_2O$ at a deposition power of 100 W and a deposition temperature of 200° C. The gas ratio of $SiH_4$ to $N_2O$ was set to 40:100 (hydrogen content: 4.3 atomic percent), 20:100, or 10:100, while determined the ratio of 40:100 as a standard. Subsequently, the SiN film having a thickness of 150 nm was deposited as a second passivation film. The deposition of the SiN film was performed by plasma CVD using PD-220NL supplied by SAMCO Inc. and using a gaseous mixture of $SiH_4$, $N_2$, and $NH_3$ at a deposition power of 100 W and a deposition temperature of 150° C.

Next, a contact hole 7 was formed in the passivation films via photolithography and dry etching and yielded a series of TFTs. The contact hole 7 was formed for probing for transistor characteristics evaluation.

The static characteristics (field-effect mobility (mobility) and S value) and stress resistance were evaluated by procedures as follows using TFTs prepared in the above manner.

Static Characteristics (Mobility and S Value) Evaluation

The Id-Vg characteristics were measured using the TFTs. The Id-Vg characteristics measurement was performed using a prober and a semiconductor parameter analyzer (Keithley 4200 SCS) while setting the gate voltage and the source-drain electrode voltages as follows:

Gate voltage: −30 to 30 V (measurement interval: 0.25 V)
Source voltage: 0 V
Drain voltage: 10 V
Measurement temperature: room temperature The field-effect mobility (mobility) μFE and S value were calculated from the measured Id-Vg characteristics by a procedure similar to that in Experimental Example 1.

The mobility and S value were evaluated in this experimental example according to criteria as follows. A sample evaluated as good was accepted in this experimental example.

Criteria for Mobility
Good (high): having a mobility of 40 cm²/Vs or more;
Fair (somewhat low): having a mobility from greater than 20 cm²/Vs to 40 cm²/Vs; and
Poor (low): having a mobility less than 20 cm²/Vs.

Criteria for S Value
Good: having an S value of 0.5 V/dec or less;
Fair: having an S value from greater than 0.5 V/dec to 1.0 V/dec; and
Poor: having an S value greater than 1.0 V/dec Stress Resistance Evaluation Next, the stress resistance was evaluated using the TFTs by a procedure as follows. The stress resistance was evaluated by performing a stress application test, in which light was applied with application of a negative bias to the gate electrode. The stress application was performed under conditions as follows:

Gate voltage: −20 V
Source/drain voltage: 10 V
Substrate temperature: 60° C.
Light Stress Conditions:
Stress application time: 2 hours
Light intensity: 25000 NIT
Light source: white LED The difference ΔVth (V) in threshold voltage (Vth) between before and after the stress application was determined by calculation. The ΔVth calculated in the above manner was evaluated according to criteria as follows. A sample evaluated as good was evaluated as having excellent stress resistance in this experimental example.

Criteria
Good: having a ΔVth (absolute value) of 4.5 V or less;
Fair: having a ΔVth (absolute value) of from greater than 4.5 V to 6.0 V; and
Poor: having a ΔVth (absolute value) greater than 6.0 V.

The results are presented in Table 8. In Table 8, the term "SD electrodes" refers to the source-drain electrodes.

TABLE 8

| No. | SD electrodes | Resist stripper | First oxide semiconductor Symbol in Table 6 | Mobility cm$^2$/Vs | S value V/dec | ΔVth (V) |
|---|---|---|---|---|---|---|
| 1 | Mo | A | A | Good (41) | Good (0.45) | −3.2 |
| 2 | Mo | B | A | Good (40) | Good (0.49) | −3.7 |
| 3 | Mo | A | B | Good (43) | Good (0.41) | −2.9 |
| 4 | Mo | B | B | Good (44) | Good (0.42) | −3.0 |
| 5 | Mo | A | C | Fair (38) | Poor (1.0) | −6.6 |
| 6 | Mo | B | C | Fair (36) | Poor (1.7) | −12.0 |

Samples Nos. 1 to 4 in Table 8 are samples each including the first and second oxide semiconductor layers specified in the present invention and had static characteristics (mobility and S value) and stress resistance both at excellent levels regardless of resist stripper type.

Independently, Sample No. 3 (using the resist stripper "A") and Sample No. 4 (using the resist stripper "B") in Table 8 were compared with each other, where both of these samples employed the oxide "B" in Table 6 to form the first oxide semiconductor layer. These samples had a mobility and an S value at approximately equivalent levels with each other, regardless of resist stripper type. This is because these samples both had an identical etching rate E/R ratio of 0 (zero) (see Samples Nos. 3 and 4 in Table 7).

In contrast, samples using the oxide "C" (IGZO) in Table 6 to form the first oxide semiconductor layer suffered from film thinning by the wet etchant (the results are not shown in this experimental example). Accordingly, Sample No. 5 (using the resist stripper "A") and Sample No. 6 (using the resist stripper "B") in Table 8 both had significantly lower stress resistance and significantly higher S values and still offered somewhat lower mobility. Sample No. 6 in Table 8 underwent increased film thinning when the resist stripper "B" was used (etching rate E/R ratio=1.0), as indicated in Sample No. 6 in Table 7. Sample No. 6 in Table 8 had mobility, S value, and ΔVth all at lower levels as compared with Sample No. 5.

This experimental example presents the results where the molybdenum single-layer film was used to form the source-drain electrodes. However, the source-drain electrodes are not limited in type to this; and it has been verified that similar results are obtained even upon the use of electrodes of other types, which are exemplified by electrodes having a multilayer structure, such as a two layer structure including Mo and Al layers, and a three-layer structure including Mo, Al, and Mo layers disposed in this order.

Experimental Example 4

BCE TFT

In this experimental example, BCE TFTs were produced and evaluated on characteristics by a procedure similar to that in Experimental Example 3, except for etching the source-drain electrodes via dry etching.

A different procedure from the production process of Experimental Example 3, namely, the dry etching step alone, will be illustrated below. A pure titanium (Ti) film was deposited in this experimental example so as to form the source-drain electrodes (S/D electrodes). The pure Ti film was deposited to a thickness of 100 nm by direct-current sputtering in a similar manner to that in the formation of the gate electrode, and then patterned via photolithography and dry etching.

The dry etching was performed using dry etching equipment using inductively coupled plasma (ICP), as described in Japanese Unexamined Patent Application Publication No. 2004-55842. The plasma generation equipment described in the literature is a plasma treatment equipment (etcher) of so-called transfer-coupled plasma (TCP) type having a flat-shaped induction window. In the equipment, one-turn 13.56 MHz RF antenna was disposed on the flat-shaped quartz induction window, and high-density plasma was generated immediately below the quartz induction window via inductive coupling. The equipment employed a substrate susceptor to bear the substrate, where a 400-kHz low-frequency wave for substrate bias had been applied to the susceptor. The etching was performed using the equipment, at a gas flow rate of Ar/Cl$_2$ of 300/200 sccm, a gas pressure of 1.9 Pa, a power (source RF) applied to the antenna of 500 W, a substrate bias of 60 W, and a substrate temperature (susceptor temperature) of 20° C. The patterning was performed so as to allow the resulting TFT to have a channel length of 10 μm and a channel width of 200 μm. The dry etching was further performed for a duration adjusted for overetching, where the duration corresponds to 50% of the thickness of the source-drain electrodes, so as to eliminate or minimize a short circuit of the source-drain electrodes and to surely perform the patterning. After the dry etching, a hardened layer on the resist surface was removed by ashing treatment (ashing) using oxygen plasma, successively in a vacuum without exposure from the chamber to the atmosphere. This treatment was performed to eliminate or minimize after-corrosion in which reaction products, which are formed as a result of dry etching and attached to the resist and/or the S/D interconnection pattern, react with moisture in the air to form hydrochloric acid (HCl), and this corrodes metals such as Al. Subsequently, the resist was removed using the resist stripper "A" or the resist stripper "B".

A passivation film and a contact hole 7 were formed by a procedure similar to that in Experimental Example 3, and a series of TFTs was yielded. The TFTs were subjected to characteristics evaluation by a procedure similar to that in Experimental Example 3.

The results are presented in Table 9.

TABLE 9

| No. | SD electrodes | Resist stripper | First oxide semiconductor Symbol in Table 6 | Mobility cm²/Vs | S value V/dec | ΔVth (V) |
|---|---|---|---|---|---|---|
| 1 | Ti | A | A | Good (42) | Good (0.35) | −3.0 |
| 2 | Ti | B | A | Good (41) | Good (0.48) | −3.7 |
| 3 | Ti | A | B | Good (45) | Good (0.34) | −3.4 |
| 4 | Ti | B | B | Good (44) | Good (0.36) | −3.5 |
| 5 | Ti | A | C | Good (43) | Good (0.38) | −5.1 |
| 6 | Ti | B | C | Poor (35) | Poor (0.9) | −10.5 |

Samples Nos. 1 to 4 in Table 9 are samples including the first and second oxide semiconductor layers specified in the present invention and had static characteristics (mobility and S value) and stress resistance both at excellent levels, regardless of resist stripper type.

Independently, Sample No. 3 (using the resist stripper "A") and Sample No. 4 (using the resist stripper "B") in Table 9 were compared with each other, where both of these samples employed the oxide "B" in Table 6 to form the first oxide semiconductor layer. These samples had a mobility and an S value both at approximately equivalent levels to each other, because these samples had an identical etching rate E/R ratio regardless of resist stripper type, as seen from Table 7.

In contrast, Sample No. 5 (using the resist stripper "A") and Sample No. 6 (using the resist stripper "B") in Table 9 had significantly lower stress resistance, because these samples employed the oxide "C" (IGZO) in Table 6 to form the first oxide semiconductor layer and underwent film thinning due to the wet etchant. For the static characteristics, i.e., mobility and S value, these characteristics were not so much lowered in this experimental example, because the film thinning by dry etching occurred slightly in this experimental example (not shown herein). Thus, Sample No. 5 had an S value and a mobility at good levels. However, Sample No. 6 had a significantly lower mobility and a significantly higher S value, because this sample used the resist stripper "B" and suffered from larger film thinning.

This experimental example presents the results where the titanium single-layer film was used to form the source-drain electrodes. However, the source-drain electrodes are not limited in type to this. It has been verified that similar results are obtained even upon the use of electrodes having a multilayer structure such as a two-layer structure including Ti and Al layers, and a three-layer structure including Ti, Al, and Ti layers disposed in this order.

LIST OF REFERENCE SYMBOLS 1 substrate
2 gate electrode
3 gate insulator film
4 second oxide semiconductor layer
4A first oxide semiconductor layer
5 source-drain electrodes
6 passivation film (insulating film)
7 contact hole
8 etch stopper layer

The invention claimed is:

1. A thin film transistor comprising:
a substrate; and, disposed on or over the substrate in the sequence set forth,
a gate electrode;
a gate insulator film;
an oxide semiconductor layer;
source-drain electrodes; and
a passivation film that protects the source-drain electrodes,
the oxide semiconductor layer being a multilayer assembly comprising:
a first oxide semiconductor layer comprising In, Ga, Zn, Sn, and O; and
a second oxide semiconductor layer comprising In, Ga, Sn, and O,
the second oxide semiconductor layer being disposed on or over the gate insulator film,
the first oxide semiconductor layer being disposed between the second oxide semiconductor layer and the passivation film,
ratios (atomic ratios, hereinafter the same) in contents of the individual metal elements to all the metal elements in the first oxide semiconductor layer meeting conditions expressed as follows:
Ga/(In+Ga) is from 0.50 to 0.80;
Ga/(In+Ga+Zn+Sn) is from 0.15 to 0.45; and
Sn/(In+Ga+Zn+Sn) is from 0.05 to 0.25,
ratios in contents of the individual metal elements to all the metal elements in the second oxide semiconductor layer meeting conditions expressed as follows:
In/(In+Ga) is from 0.60 to 0.75;
In/(In+Ga+Sn) is from 0.30 to 0.58; and
Sn/(In+Ga+Sn) is from 0.15 to 0.38.

2. The thin film transistor according to claim 1,
wherein the second oxide semiconductor layer has a thickness of 5 nm or more.

3. The thin film transistor according to claim 1,
wherein the film to form the source-drain electrodes comprises a film of at least one metal selected from the group consisting of Mo, Mo alloys, Ti, Ti alloys, and combinations thereof.

4. The thin film transistor according to claim 1,
wherein the film to form the source-drain electrodes is a multilayer film having a multilayer structure comprising:
a film of at least one metal selected from the group consisting of Mo, Mo alloys, Ti, Ti alloys, and combinations thereof; and
a film of at least one metal selected from the group consisting of Al, Al alloys, Cu, Cu alloys, and combinations thereof,
disposed in the specified order from the oxide semiconductor layer side.

5. A display device comprising the thin film transistor according to claim 1.

6. A thin film transistor comprising:
a substrate; and, disposed on or over the substrate in the sequence set forth,
a gate electrode;
a gate insulator film;
an oxide semiconductor layer;
an etch stopper layer;
source-drain electrodes; and a passivation film that protects the source-drain electrodes, the oxide semiconductor layer being a multilayer assembly comprising:

a first oxide semiconductor layer comprising In, Ga, Zn, Sn, and O; and a second oxide semiconductor layer comprising In, Ga, Sn, and O, the second oxide semiconductor layer being disposed on or over the gate insulator film, the first oxide semiconductor layer being disposed between the second oxide semiconductor layer and the etch stopper layer, ratios in contents of the individual metal elements to all the metal elements in the first oxide semiconductor layer meeting conditions expressed as follows:

Ga/(In+Ga) is from 0.50 to 0.80;

Ga/(In+Ga+Zn+Sn) is from 0.15 to 0.45; and

Sn/(In+Ga+Zn+Sn) is from 0.05 to 0.25, ratios in contents of the individual metal elements to all the metal elements in the second oxide semiconductor layer meeting conditions expressed as follows:

In/(In+Ga) is from 0.60 to 0.75;

In/(In+Ga+Sn) is from 0.30 to 0.58; and

Sn/(In+Ga+Sn) is from 0.15 to 0.38.

7. The thin film transistor according to claim 6,
wherein the second oxide semiconductor layer has a thickness of 5 nm or more.

8. The thin film transistor according to claim 6,
wherein a resist stripper is used in etching and photolithography of a film to form the source-drain electrodes.

9. The thin film transistor according to claim 8,
wherein the etching is performed via wet etching or dry etching.

10. The thin film transistor according to claim 9,
wherein the etching is performed via wet etching using an acid etchant.

11. A display device comprising the thin film transistor according to claim 6.

* * * * *